(12) United States Patent
Fujino et al.

(10) Patent No.: US 7,728,343 B2
(45) Date of Patent: Jun. 1, 2010

(54) LIGHT SOURCE APPARATUS AND DISPLAY APPARATUS AND WHITE RESIST LAYER

(75) Inventors: Toyomi Fujino, Kanagawa (JP); Masaru Fujii, Tokyo (JP); Hiroyuki Fukasawa, Tokyo (JP)

(73) Assignee: Sony Corporation, Tokyo (JP)

( * ) Notice: Subject to any disclaimer, the term of this patent is extended or adjusted under 35 U.S.C. 154(b) by 246 days.

(21) Appl. No.: 11/909,033

(22) PCT Filed: Dec. 27, 2006

(86) PCT No.: PCT/JP2006/326064

§ 371 (c)(1),
(2), (4) Date: Sep. 18, 2007

(87) PCT Pub. No.: WO2007/086229

PCT Pub. Date: Aug. 2, 2007

(65) Prior Publication Data

US 2009/0141492 A1    Jun. 4, 2009

(30) Foreign Application Priority Data

Jan. 26, 2006  (JP) .............................. 2006-017922

(51) Int. Cl.
  *H01L 27/15*  (2006.01)
  *H01L 31/12*  (2006.01)
  *H01L 33/00*  (2006.01)
  *H01L 29/267* (2006.01)

(52) U.S. Cl. .............................. 257/98; 257/81; 257/99; 257/100; 257/433

(58) Field of Classification Search .................. 257/81, 257/91, 98, 99, 100, 433
See application file for complete search history.

(56) References Cited

U.S. PATENT DOCUMENTS 5,298,768 A *  3/1994  Okazaki et al. ................ 257/81
6,280,861 B1 * 8/2001  Hosokawa et al. .......... 428/690
6,313,532 B1 * 11/2001 Shimoishizaka et al. .... 257/734
7,365,371 B2 *  4/2008  Andrews ...................... 257/99

(Continued)

FOREIGN PATENT DOCUMENTS

JP       04-258184       9/1992

(Continued)

OTHER PUBLICATIONS

Japanese Office Action issued on Nov. 6, 2007.

(Continued)

*Primary Examiner*—Leonardo Andújar
*Assistant Examiner*—Teresa Arroyo
(74) *Attorney, Agent, or Firm*—Sonnenschein Nath & Rosenthal LLP

(57) ABSTRACT

A light source apparatus is configured to generate light efficiently from a light-emitting device. The light source apparatus includes a substrate having a pair of electrodes, a light-emitting device and a transparent resin for sealing the light-emitting device. A white resist layer is formed on the substrate. The white resist layer is formed to cover apart of the electrodes. The white resist layer 6 includes an opening corresponding to the light-emitting device. A white member for controlling a shape of the transparent resin is formed on the white resist layer.

28 Claims, 15 Drawing Sheets

U.S. PATENT DOCUMENTS

| | | | |
|---|---|---|---|
| 7,547,566 B2 * | 6/2009 | Ishii et al. | 438/29 |
| 2002/0000655 A1 * | 1/2002 | Shimoishizaka et al. | 257/734 |
| 2003/0079986 A1 * | 5/2003 | Ikegawa | 204/230.2 |
| 2006/0158111 A1 * | 7/2006 | Hayashi | 313/512 |
| 2006/0186431 A1 * | 8/2006 | Miki et al. | 257/100 |
| 2008/0137331 A1 * | 6/2008 | Kaneko et al. | 362/231 |
| 2008/0258164 A1 * | 10/2008 | Masui et al. | 257/98 |
| 2008/0284315 A1 * | 11/2008 | Tasumi et al. | 313/503 |
| 2009/0026485 A1 * | 1/2009 | Urano et al. | 257/99 |
| 2009/0166608 A1 * | 7/2009 | Nakanishi et al. | 257/13 |

FOREIGN PATENT DOCUMENTS

| | | |
|---|---|---|
| JP | 10026774 A * | 1/1998 |
| JP | 2003-234510 | 8/2003 |
| JP | 2003-318449 | 11/2003 |
| JP | 2004-199184 | 7/2004 |
| JP | 2005-303211 | 10/2005 |
| WO | 2005/031882 | 4/2005 |

OTHER PUBLICATIONS

International Search Report dated Apr. 10, 2007.

* cited by examiner

29

LIGHT SOURCE APPARATUS AND DISPLAY APPARATUS AND WHITE RESIST LAYER

TECHNICAL FIELD

The present invention relates to a light source apparatus including a light-emitting device such as a light-emitting diode as a light source and the light source apparatus is suitable for use as the application to an illumination light source apparatus that can obtain a surface-light source of desired color (white or other colors). Also, the present invention relates to a display apparatus including a light source apparatus which illuminates a display unit from the back.

BACKGROUND ART

Since light-emitting diodes become able to generate high outputs in recent years, a white LED light source using a light-emitting diode (LED) is widely used to emit white light.

In particular, such white LED light source may be applied to illumination apparatuses which are requested to generate high intensity, to projector apparatuses and backlights for large-scale liquid-crystal displays. For the uses, since the white LED light source has merits that it is mercury-free to have small environmental load, it is excellent in color reproducibility, it is excellent in responsiveness, it can vary intensity and that it is long in product life, a white LED light source is expected as a white light source instead of related-art fluorescent lamps (hot cathode tube and cold cathode tube).

In order to save energy, that is, to improve efficiency in the above-mentioned white LED light source, it is important not only to improve luminous efficiency of the light-emitting diode itself but also to improve efficiency at which light can be emitted from a light-emitting diode chip.

The efficiency at which light can be emitted from the light-emitting diode chip is greatly influenced by assembly members located around the light-emitting diode chip.

Specifically, in order to improve light emitting efficiency, it is necessary to contrive assembly members located around the light-emitting diode chip.

As forms for connecting the electrodes on the substrate to the light-emitting diode chips, there may be a form in which the light-emitting diode packages are arrayed on the substrate, a form in which the light-emitting diode chips are directly mounted on the substrate and connected to the electrodes by wires or the like and a transparent resin is further formed to cover the light-emitting diode chips to seal the light-emitting diode chips (see Patent Document 1 and Patent Document 2, for example) and the like.

[Patent Document 1] Japanese Unexamined Patent Application Publication No. 10-294498

[Patent Document 2]: Japanese Unexamined Patent Application Publication No. 61-144890

DISCLOSURE OF THE INVENTION

However, the arrangements that have been proposed so far are still insufficient to improve efficiency at which light can be emitted from the light-emitting diode chips.

In order to solve the above-mentioned problems, the present invention provides a light source apparatus which can improve efficiency at which light is emitted from light-emitting diode chips and to provide a display apparatus including the light source apparatus.

A light source apparatus according to the present invention includes a substrate including at least a pair of electrodes, at least one light-emitting device and a transparent resin for sealing the light-emitting devices, in which a white resist layer is formed on the substrate, the white resist layer is formed on the substrate to cover part of the electrodes and includes an opening portion formed on the light-emitting device, near the light-emitting device and on a terminal of the electrode and a white or transparent member for controlling a shape of the transparent resin is formed on the white resist layer.

According to the above-mentioned arrangement of the light source apparatus of the present invention, since the white resist layer is formed on the substrate having at least the pair of electrodes, the white resist layer has high reflectance with the result that it is possible to efficiently emit light to the outside of the transparent resin by increasing the reflectance within the transparent resin.

Also, since the white resist layer has the opening portion formed on the light-emitting device, near the light-emitting device and on the terminal of the electrode, the terminal of the electrode and the light-emitting device can be electrically connected to each other through the opening portion of the white resist layer.

Further, since the white or transparent member that can control the shape of the transparent resin is formed on the white resist layer, the shape of the transparent resin can be controlled by the white or transparent member to be a predetermined shape when the light source apparatus is fabricated. Also, when the light source apparatus is in use, even if light emitted from the light-emitting device is applied to the member, the member is white or transparent so that the light is hardly absorbed by the white or transparent member; accordingly, from this viewpoint, it is possible to use emitted light with high efficiency.

The light source apparatus according to the present invention includes a substrate having at least a pair of electrodes, at least one light-emitting device and a transparent resin for sealing the light-emitting device, in which a white resist layer is formed on the substrate, the white resist layer has an opening portion formed around the transparent resin and the white resist layer also serves as the member that can control the shape of the transparent resin.

According to the above-mentioned arrangement of the light source apparatus of the present invention, since the white resist layer is formed on the substrate and the white resist layer has high reflectance, the reflectance within the transparent resin is improved so that light can be efficiently emitted to the outside of the transparent resin.

Also, since the white resist layer includes the opening portion formed around the transparent resin and the white resist layer also serves as the member to control the shape of the transparent resin, the shape of the transparent resin can be controlled by the white or transparent member to be a predetermined shape when the light source apparatus is fabricated.

Further, a display apparatus according to the present invention includes a display unit for displaying images and a light source apparatus for illuminating the display unit from the back, in which the light source apparatus has the above-described arrangement of the light source apparatus according to the present invention.

According to the above-mentioned arrangement of the display apparatus of the present invention, since the light source apparatus for illuminating the display unit from the back has the arrangement of the light source apparatus of the present invention, light can be efficiently emitted to the outside of the transparent resin with the result that it becomes possible to sufficiently maintain brightness of images displayed on the display unit.

According to the above-mentioned light source apparatus of the present invention, light can be efficiently emitted to the outside of the transparent resin. Also, since the shape of the transparent resin can be controlled to be a predetermined shape when the light source apparatus is fabricated, the transparent resin can be formed to be a shape with low inside reflection, such as a spherical shape, thereby efficiently emitting light to the outside of the transparent resin.

As described above, since light can be efficiently emitted to the outside of the transparent resin, intensity of emitted light can be maintained sufficiently. Also, since intensity of emitted light can be maintained sufficiently, intensity equal to that of the related-art arrangement can be obtained by low energy.

Accordingly, power consumption of the light source apparatus can be reduced to save energy and to extend a product life of the light source apparatus.

Also, the number of the light-emitting devices can be reduced to save space and to reduce component cost.

Also, according to the display apparatus of the present invention, since it becomes possible to sufficiently maintain brightness of images displayed on the display unit, images can be displayed by lower energy than the related art.

Accordingly, power consumption of the display apparatus can be reduced to save energy and to extend a product life of the display apparatus.

Also, the number of the light-emitting devices can be reduced to make the display apparatus small-sized and to reduce component cost.

BEST MODE FOR CARRYING OUT THE INVENTION

Figure 1A:
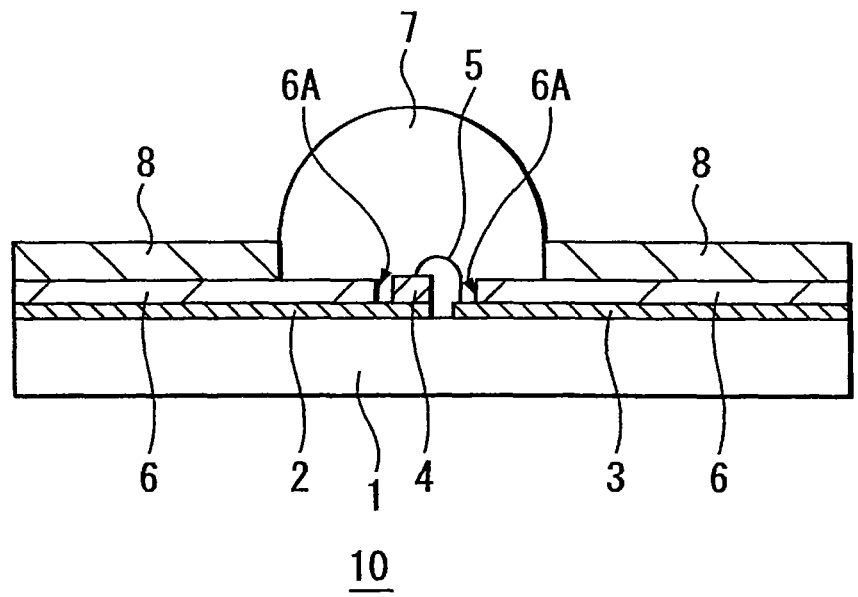
FIGS. 1A and 1B are schematic diagrams of main portions of a light source apparatus according to an embodiment of the present invention.

First, prior to explanations of specific embodiments of the present invention, a summary of the present invention will be explained.

In a light source apparatus having an arrangement using a light-emitting device chip such as a light-emitting diode and in which the light-emitting device chip is sealed by a transparent resin, efficiency at which light is emitted from the light-emitting device chip to the outside is influenced by assembly members located around the chip as mentioned hereinbefore.

As influences exerted by such assembly members, there may be the following factors, for example.

(A) Transmittance of transparent resin;

(B) Refractive index of transparent resin;

(C) Shape (thickness/shape of curvature) of transparent resin;

(D) Surface shape of substrate in the inside of transparent resin;

(E) Reflectance of substrate surface in the inside of transparent resin.

Of these factors, with respect to (A) transmittance of sealing resin, high transmittance is desirable.

Also, with respect to (B) refractive index of sealing resin, it is desirable that a difference between refractive index of sealing resin and that of the outside should be small.

Also, with respect to (C) shape of transparent resin, if the transparent resin has a spherical shape, then it is possible to reduce reflection on an interface between the resin and the outside.

According to the present invention, by improving (D) the surface shape of the substrate within the transparent resin and (E) reflectance on the substrate surface within the transparent resin, light emitting efficiency can be improved and (C) the transparent resin can be formed to be an excellent shape.

Hence, according to the present invention, a light source apparatus is configured such that a white resist layer is formed on a substrate including at least a pair of electrodes to cover part of the electrodes, the white resist layer has an opening portion formed on at least a light-emitting device, near the light-emitting device and on the terminal of the electrode and that a white or transparent member that can control a shape of the transparent resin is formed on the white resist layer.

Alternatively, a light source apparatus may be configured such that, instead of forming a white or transparent member, a white resist layer includes an opening portion formed around a transparent resin and that the white resist layer also serves as a member to control the shape of the transparent resin.

Since the white resist layer is formed on the substrate including at least the pair of electrodes, the white resist layer has high reflectance so that reflectance within the transparent resin is improved and light can efficiently be emitted to the outside of the transparent resin.

Also, since the white resist layer includes the opening portion formed on the light-emitting device, near the light-emitting device and on the terminal of the electrode, the terminal of the electrode and the light-emitting device can be connected electrically through the opening portion of the white resist layer.

Further, since the white or transparent member to control the shape of the transparent resin is formed on the white resist layer, the shape of the transparent resin can be controlled by the white or transparent member to be a predetermined shape when the light source apparatus is fabricated. Also, when the light source apparatus is in use, if light emitted from the light-emitting device is applied to the member, the member is white or transparent so that emitted light is hardly absorbed by the member; accordingly, also from the viewpoint, emitted light can be used efficiently.

As described above, since light can be efficiently emitted to the outside of the transparent resin, sufficiently high intensity of emitted light can be maintained. Also, since intensity of emitted light can be maintained sufficiently, high intensity equal to that of the related-art arrangement can be obtained with low energy.

Accordingly, power consumption of a light source apparatus can be reduced to save energy and to extend a product life of a light source apparatus.

Further, since the number of light-emitting devices, for example, is reduced, it becomes possible to reduce an area occupied by the light-emitting devices and volume thereof, thereby saving space and reducing component cost.

As a material of the white resist layer or white resist, a resist containing white titanium oxide, a solder resist "FINEDEL DSR-330S42-13W (trade name) manufactured by TAMURA KAKEN CORPORATION, and the like can be used.

A white film formed by silk screen printing or white film formed by mark printing, for example, can be used as the white member.

As a material of the white film formed by such printing, white mark ink material such as "S-100 W CM29" (trade name) of a thermal curable (one component) marking ink or "PHOTO FINER PMR-6000 W30/CA-40 G30" (trade name) of a photoimageable marking ink manufactured by TAIYO INK MFG. CO., LTD can be used.

As a material of the transparent member, it is possible to use a transparent film to which a water- and oil-repellent ink containing a transparent fluorine material, for example, is coated by pad printing.

As a material of the transparent film formed by such printing or coating, a water- and oil-repellent agent "FS-1010Z-10" (trade name) manufactured by FLUORO TECHNOLOGY CO., LTD can be used.

According to the present invention, if the white resist layer is further formed by stacking two or more resist layers, then it is possible to improve reflectance by increasing the thickness of the white resist layer.

If one resist layer is formed to be thick, then the resist layer becomes difficult to be cured so that it may take plenty of time to cure the resist layer or it may be necessary to illuminate the resist layer with intensified exposure light to develop the resist layer completely. Accordingly, there is a limit to increasing the thickness of the resist layer of one layer.

On the other hand, if the thick white resist layer is formed by stacking the two or more resist layers, then the resist layers of sufficiently large thicknesses can be formed and the respective resist layers can be cured at a high speed.

Further, in the present invention, when the white resist layer is formed by stacking the two resist layers, if in the vicinity of the light-emitting device the area and position of the opening of the upper layer are different from those of the lower layer, then it is possible to improve reflectance in respective characteristics in shape.

When the area of the opening of the upper layer is made larger than that of the opening of the lower layer in the vicinity of the light-emitting device, the edge of the upper layer is located behind the edge of the lower layer so that the opening has a stepped cross-section. As a result, the opening has a shape which is opened in the upper direction so that light can be reflected readily in the upper direction.

If the area of the opening of the upper layer is made smaller than that of the opening of the lower layer in the vicinity of the light-emitting device, then the edge of the upper layer overhangs the edge of the lower layer so that an edge of the surface is rounded. Consequently, also in this case, the opening has a shape opened in the upper direction and hence it is easy to reflect light in the upper direction.

If the area of the opening of the upper layer and that of the opening of the lower layer are made equal to each other in the vicinity of the light-emitting device but the position of the opening of the upper layer is made different from that of the lower layer, then the edge of the upper layer is located behind the edge of the lower layer on one side and the edge of the upper layer overhangs the edge of the lower layer on the other side in the direction in which the positions of the opening are displaced. As a result, on each of the sides, the opening has a shape opened in the upper direction and hence it becomes easy to reflect light in the upper direction. Further, since the position of the opening of the upper layer is different from that of the lower layer, the area of the opening, which is covered with neither the upper layer nor the lower layer, can be reduced in the vicinity of the light-emitting device; thus, it becomes possible to further improve reflectance in the vicinity of the light-emitting device.

If the opening has a shape of those three kinds, even if the positions of the resist layers of the two layers are displaced from a predetermined position up to a certain extent, light can be emitted easily in the upper direction while the opening is kept in the shape that is opened in the upper direction.

Further, if in the white resist layer formed of one resist layer, or two or more resist layers, the opening portion of the whole white resist layer or the opening portion in the vicinity of the light-emitting device of each resist layer has a shape of an inclined plane which is opened in the upper direction, then light can be easily emitted in the upper direction, similarly.

Furthermore, if a light-emitting device is of a light-emitting device of a lower surface-emission type (a light-emitting layer is located under a device), then the light-emitting device is mounted on the substrate with a gap between them by bump connection, and the upper surface of the white resist layer is located under the light-emitting layer of the light-emitting device. As a consequence, it is possible to increase reflectance by upwardly reflecting light (in particular, light emitted in the lateral direction and light emitted in the lower oblique direction) emitted from the light-emitting layer.

In such arrangement, when the dimension of the opening portion of the white resist layer is further made smaller than the outer dimension of the light-emitting device, the white resist layer is extended under the light-emitting device with the result that it is possible to further improve reflectance by upwardly reflecting light emitted in the lower direction from the light-emitting layer.

It should be noted that, even when a light-emitting device is of a light-emitting device of an upper surface-emission type, the light-emitting device emits light in the lateral direction and the lower oblique direction from the light-emitting layer, and if the white resist layer has a similar arrangement, then it is possible to improve reflectance by reflecting emitted light in the upper direction.

Also, the arrangement can be applied to a lower layer having an arrangement in which the opening has a shape having a stepped cross-section by making the area of the opening of the upper layer become larger than that of the lower layer in the vicinity of the light-emitting device in the resist layer including the aforementioned two layers, thereby obtaining similar effects.

Also, according to the present invention, if an identifying member to determine the position to connect the light-emitting device to the substrate is further formed on the electrode at the portion under the light-emitting device, or the identifying member is formed on the surface of the substrate outside the transparent resin, then light emitted from the light-emitting device can be prevented from being absorbed or scattered by the identifying member, thereby improving reflectance on the surface of the substrate.

When the identifying member is formed on the electrode at the portion under the light-emitting device, since the identifying member is hidden by the light-emitting device chip after the light-emitting device is mounted on the substrate, emitted light becomes difficult to be applied to the identifying member. When the identifying member is formed on the surface of the substrate outside the transparent resin, the identifying member is away from the light-emitting device so that emitted light may not be applied to the identifying member.

While the marking ink used for the aforementioned white member and the like can be used as such identifying member, the identifying member is not necessarily limited to the white marking ink and marking inks of other colors can be used as the identifying member.

It should be noted that, when the identifying member is formed on the surface of the substrate outside the transparent resin, if the identifying member is formed on the white resist layer or the white substrate, then the identifying member formed of the marking inks of other colors than white can identify the position more easily.

Also, a corner portion of the electrode located within the opening portion of the white resist layer can be used as the identifying member. Also in that case, the corner portion of the electrode may be hidden by the light-emitting device chip after the light-emitting device is mounted on the substrate.

Then, when the light-emitting device is mounted on the substrate using the identifying member, the position to mount the light-emitting device may be confirmed by searching for the identifying member with a device such as a camera.

Also, in the present invention, if light-emitting devices emit light of at least two kinds of colors including red, the opening portion of the white resist layer is formed with a large area within the transparent resin that seals the red light-emitting device and the electrode faces the transparent resin from the opening portion (the electrode directly contacts with the transparent resin), then high reflectance can be obtained on the surface of the substrate of the red light-emitting device.

Specifically, since light having wavelength near a wavelength of red can be reflected highly on metal materials used for electrodes and the reflectance of the metal materials is higher than that of the white resist layer, then reflectance of the red light-emitting device can be increased more if the opening portion of the white resist layer is formed with the large area so that the electrode faces the transparent resin (the electrode directly contacts with the transparent resin).

On the other hand, since light having wavelength near a wavelength of emitted light may be reflected highly on the white resist layer than on the electrode materials in the light-emitting devices that emit light of green and blue, it is desirable that the opening portion of the white resist layer should be formed with a small area.

Here, reflectance depending on a wavelength is compared with respect to gold, silver, and copper which is used as a metal material for electrodes.

Gold has high reflectance for light of a wavelength near red light, its reflectance is lowered to approximately 75% for light of a wavelength near green light and it is lowered to 40% or less for light of a wavelength near blue light.

Silver has high reflectance for the whole of visible rays of light.

Copper has high reflectance for light of a wavelength near red light and its reflectance is lowered to approximately 60% for light of a wavelength near green light; further, reflectance of copper is gradually lowered as a wavelength becomes shorter from a wavelength near green light to a wavelength near blue light. Copper has reflectance of about 55% for a wavelength near blue light and the reflectance is higher than that of gold.

Also, in the present invention, a transparent water-repellent paint can be formed further on the white resist layer or the white member as a water-repellent material.

As described above, since the water-repellent material made of the water-repellent paint is provided on the white resist layer or the white member, even if water-repellency of the white resist layer or the white member is not sufficient, those can be water-repellent so that the shape of the transparent resin can be controlled by the water-repellent material.

It should be noted that, while one substrate may form the white resist layer of the whole light source apparatus, a light source apparatus may be configured by locating a plurality of substrates (relatively small-sized substrates) at constant intervals with a predetermined number of light-emitting devices respectively mounted thereon.

Also, if light-emitting devices in respective substrates are independently driven in the arrangement in which the light source apparatus includes a plurality of substrates, then it becomes possible to optimize intensity and the like in each substrate.

In addition, while the arrangement of the light-emitting devices is not limited in particular, however, if light-emitting devices that emit light of the same color, for example, are located at constant intervals, arrangements of wirings, electrodes, color distributions and the like may be equal to each other.

Figure 1B:
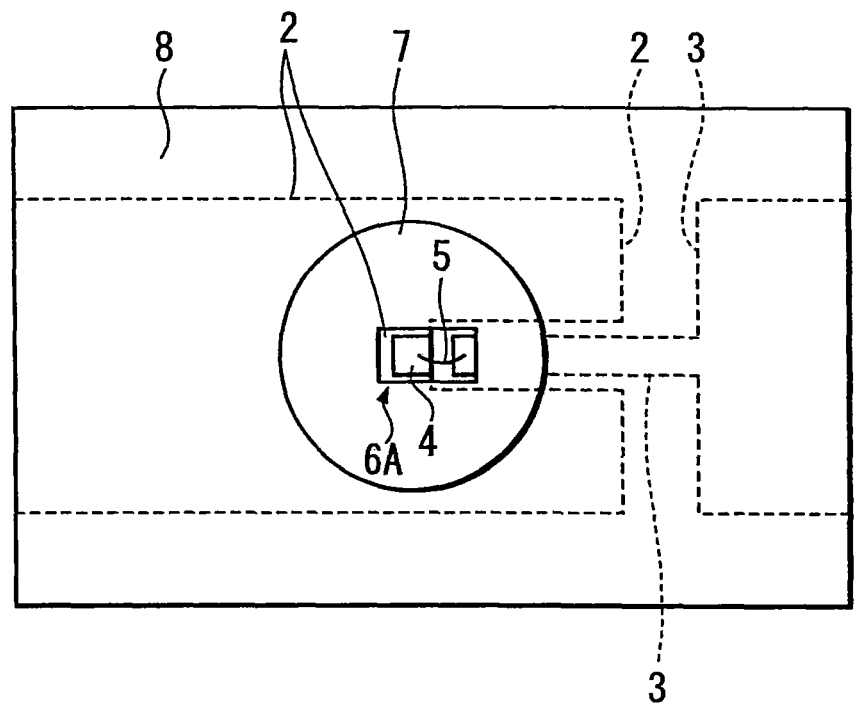

FIGS. 1A and 1B show schematic diagrams of main portions of a light source apparatus according to an embodiment of the present invention. FIG. 1A is a cross-sectional view and FIG. 1B is a plan view.

A light source apparatus 10 is configured such that a pair of electrodes 2, 3 are formed on a substrate 1, a light-emitting diode chip 4 connected to these electrodes 2, 3 being sealed by a transparent resin 7.

The light-emitting diode chip 4 is located on one electrode 2 and electrically connected to the electrode 2. Also, the chip 4 and the other electrode 3 are electrically connected with a wire 5.

The transparent resin 7 has a dome shape an upper surface of which is spherical.

In the light source apparatus 10 according to the embodiment of the present invention, in particular, a white resist layer 6 is formed on the substrate 1.

Further, the white resist layer 6 has an opening portion formed around the light-emitting diode chip 4 and the terminal of the electrode 3 connected to the wire 5, and the white resist layer covers the electrodes 2, 3 at other portions than the opening portion.

The opening portion has a rectangular shape as shown in FIG. 1B. A wall surface 6A of the opening portion is located at the position near the chip 4 and the terminal of the electrode 3.

Further, in the light source apparatus 10 according to the embodiment of the present invention, a white mark ink member 8 is provided around the transparent resin 7 and the white mark ink member 8 is used to control the shape of the transparent resin 7.

The white mark ink member 8 can be formed by a printing method such as silk screen printing.

As a material of the white mark ink member 8, the aforementioned marking ink can be used, for example.

It should be noted that a material of the substrate 1 is not particularly limited but it may be formed of typical printed boards. If a white substrate using a pre-preg material such as a glass epoxy copper-clad laminated plate is used as the material of the substrate, then reflectance of the substrate 1 can be increased.

According to the light source apparatus 10 of the above-mentioned embodiment, since the white resist layer 6 is formed on the substrate 1 and the white resist layer 6 covers the electrodes 2, 3 at other portions than the opening portion, reflectance on the side of the substrate 1 can be increased as compared with the case in which the electrodes 2, 3 directly face the transparent resin 7.

In consequence, an amount of light emitted upward from the transparent resin 7 increases to improve efficiency in using light.

Further, according to the light source apparatus 10 of the embodiment of the present invention, since the white mark ink member 8 is provided around the transparent resin 7 and the shape of the transparent resin 7 is controlled by the white mark ink member 8, as compared with members such as resin, which is not white, that have been used so far to control the shape of the transparent resin, an amount of light absorbed by the member can be reduced and a large amount of light emitted from the light-emitting diode can be reflected.

In addition, since the white mark ink member 8 has reflectance equivalent to that of the white resist layer 6, reflectance on the circumference of the transparent resin 7 can be increased.

According to the light source apparatus 10 of the embodiment of the present invention, since light can be efficiently emitted to the outside of the transparent resin 7, it is possible to sufficiently maintain intensity of emitted light.

Also, since intensity of emitted light can be maintained sufficiently, it becomes possible to obtain intensity equivalent to that of the related-art arrangement with low energy.

Accordingly, power consumption of the light source apparatus 10 can be reduced to save energy and a product life thereof can be extended.

Further, if the number of the light-emitting diode chips 4, for example, is reduced, then it becomes possible to save space and to reduce component cost by reducing areas and volumes occupied by the chips 4.

Figure 2A:
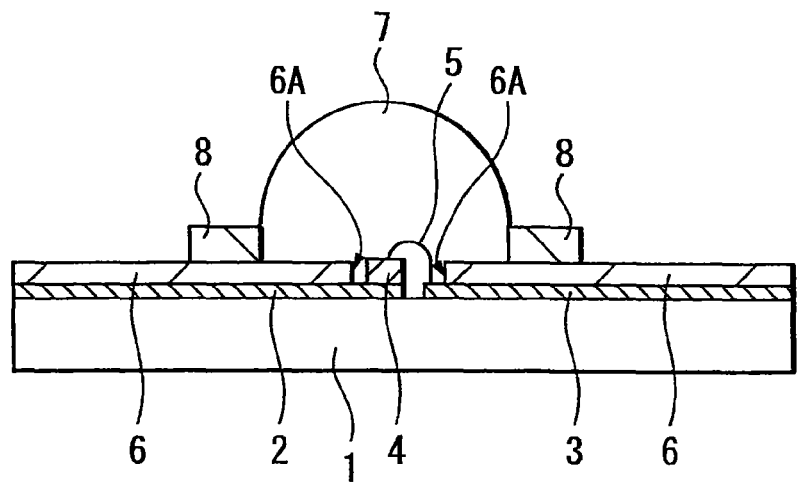
FIGS. 2A and 2B are schematic diagrams of main portions of a modified example of the embodiment of FIG. 1.
Figure 2B:
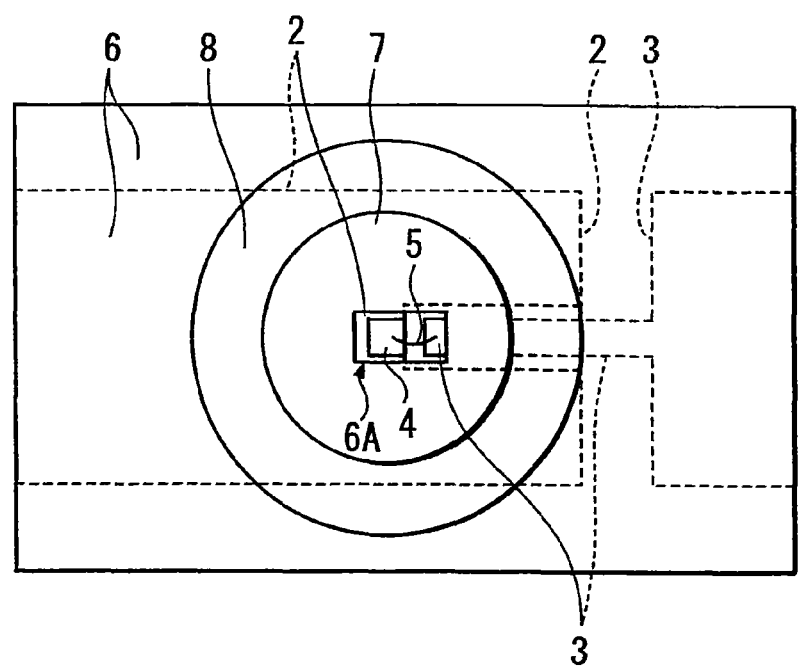

Next, FIGS. 2A and 2B show schematic diagrams of main portions of a light source apparatus obtained by partly modifying the light source apparatus 10 shown in FIG. 1.

In a light source apparatus 11 shown in FIGS. 2A and 2B, in particular, the white mark ink member 8 in ring shape is formed only on the circumference of the transparent resin 7.

Also in such case, the shape of the transparent resin 7 can be controlled by the white mark ink member 8.

In addition, since the white mark ink member 8 is formed around the transparent resin 7, light can be prevented from being absorbed by the member and hence it is possible to reflect a large amount of light emitted from the light-emitting diode.

Since the white mark ink member 8 that contributes to reflectance is not provided to the other portion than the circumference of the transparent resin 7 so that only the white resist layer 6 forms the thickness and reflectance at that portion is slightly lowered as compared with the light source apparatus 10 shown in FIG. 1. On the other hand, since the region in which the white mark ink member 8 is formed is limited to the circumference of the transparent resin 7, it is possible to reduce a cost of a material of the white mark ink member 8.

The rest of arrangement is similar to that of the light source apparatus 10 shown in FIG. 1 and therefore need not be described repeatedly.

Figure 3:
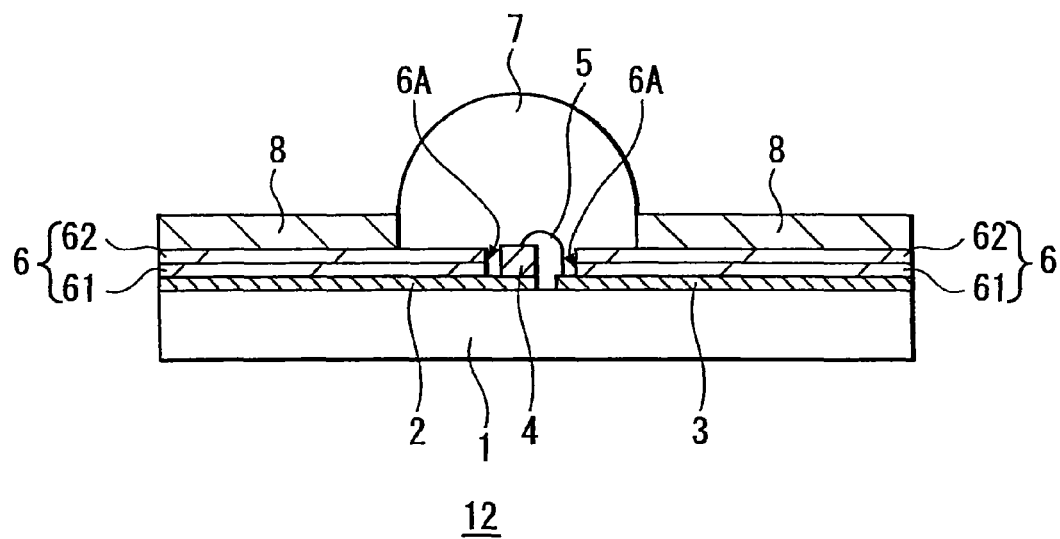
FIG. 3 is a cross-sectional view of main portions of a light source apparatus according to an embodiment of the present invention.

Next, FIG. 3 shows a schematic diagram (cross-sectional view) of main portions of a light source apparatus according to another embodiment of the present invention.

In a light source apparatus 12 according to the embodiment of the present invention, the white resist layer 6 is formed by stacking two resist layers 61, 62.

As described above, since the white resist layer 6 is formed by stacking the two resist layers 61, 62, it becomes easy to form the thick white resist layer 6.

If one resist layer is formed to be thick, then exposure light becomes difficult to reach the lower portion of the resist layer with the result that the resist layer becomes difficult to cure. Accordingly, it takes plenty of time to cure a resist layer or it becomes necessary to illuminate the resist layer with intensive exposure light so as to completely develop the resist layer. Therefore, the thickness of the resist layer of one layer may be limited.

On the other hand, if the thick white resist layer 6 is formed by stacking the resist layers 61, 62 of two or more layers, then a sufficiently thick white resist layer can be formed and the respective resist layers 61, 62 can be cured quickly.

It should be noted that, in the light source apparatus 12 according to the embodiment of the present invention, the positions of the opening portions of the two resist layers 61, 62 are identical to each other so that the wall surfaces 6A of the opening portions can be integrated substantially.

The rest of arrangement is similar to that of the light source apparatus 10 shown in FIG. 1 and therefore need not be described repeatedly.

Figure 4:
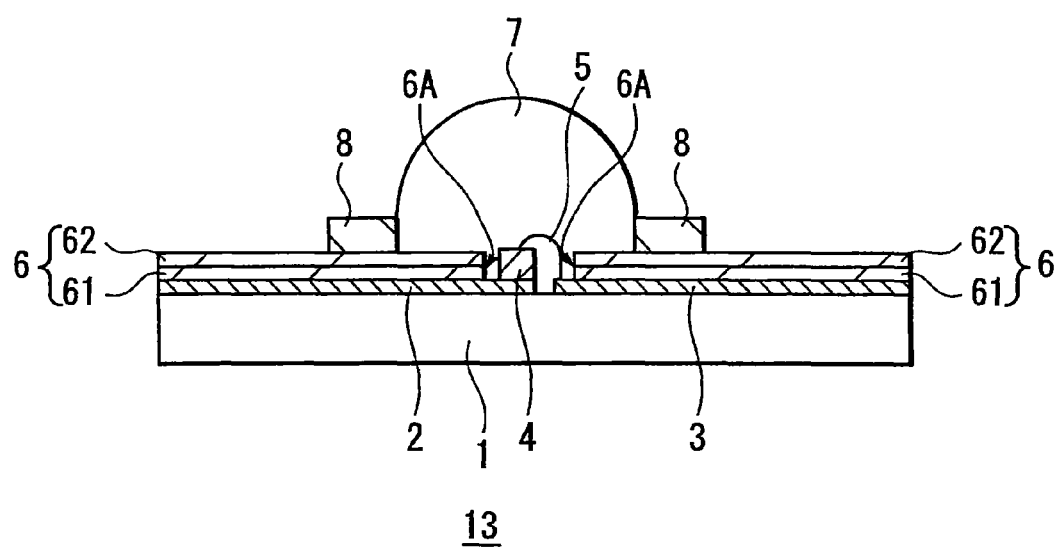
FIG. 4 is a cross-sectional view of main portions of a modified example of the embodiment of FIG. 3.

Next, FIG. 4 shows a schematic diagram (cross-sectional view) of main potions of a light source apparatus obtained by partly modifying the light source apparatus 12 shown in FIG. 3.

In a light source apparatus 13 shown in FIG. 4, the ring-shaped white mark ink member 8 is formed only around the transparent resin 7 similarly to the light source apparatus 11 shown in FIGS. 2A and 2B.

The rest of arrangement is similar to that of the light source apparatus 12 shown in FIG. 3.

Figure 5:
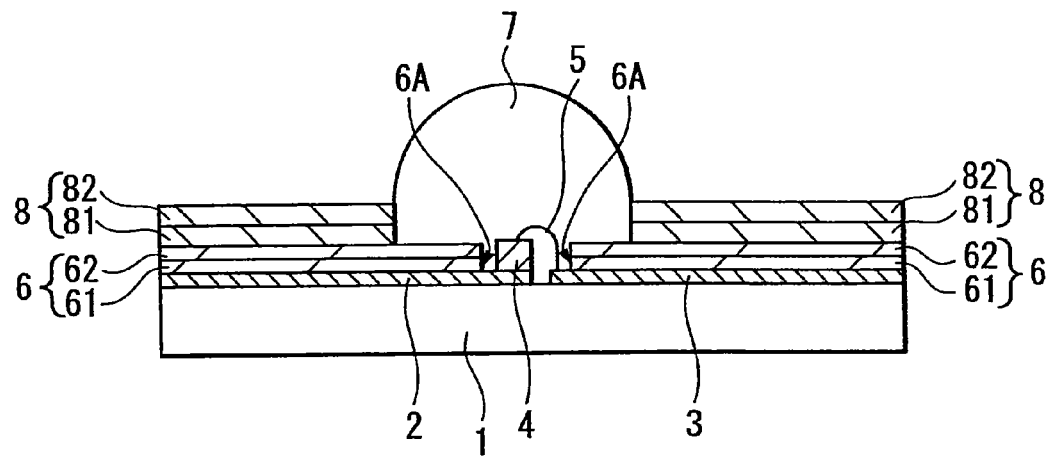
FIG. 5 is a cross-sectional view of main portions of a light source apparatus according to an embodiment of the present invention.

Next, FIG. 5 shows a schematic diagram (cross-sectional view) of main portions of a light source apparatus according to further another embodiment of the present invention.

In a light source apparatus 14 according to the embodiment of the present invention, the white resist layer 6 is formed by stacking the two resist layers 61, 62. Further, the white mark ink member 8 is formed by stacking two ink members 81, 82.

The two ink members 81, 82 of layers have an identical planar pattern.

Since the white resist layer 6 is formed by stacking the two resist layers 61, 62, it becomes easy to form the thick white mark ink member 8.

Also, since the white mark ink member 8 is formed by stacking two layers of the ink members 81, 82, the thick white mark ink member 8 can be formed.

Figure 6:
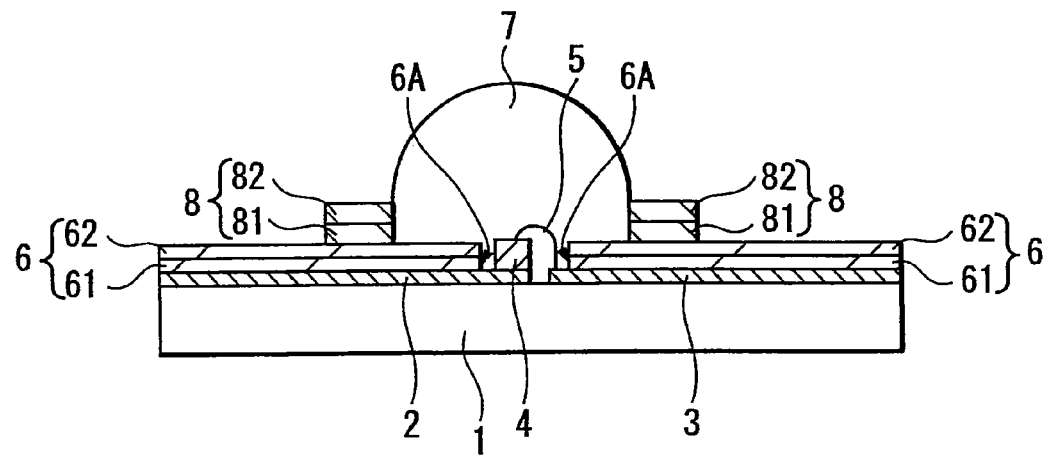
FIG. 6 is a cross-sectional view of main portions of a modified example of the embodiment of FIG. 5.

Next, FIG. 6 shows a schematic diagram (cross-sectional view) of main portions of a light source apparatus obtained by partly modifying the light source apparatus 14 shown in FIG. 5.

In a light source apparatus 15 shown in FIG. 6, the ring-shaped white mark ink member 8 is formed only around the transparent resin 7 similarly to the light source apparatus 11 shown in FIGS. 2A and 2B.

The rest of arrangement is similar to that of the light source apparatus 14 shown in FIG. 5.

Figure 7:
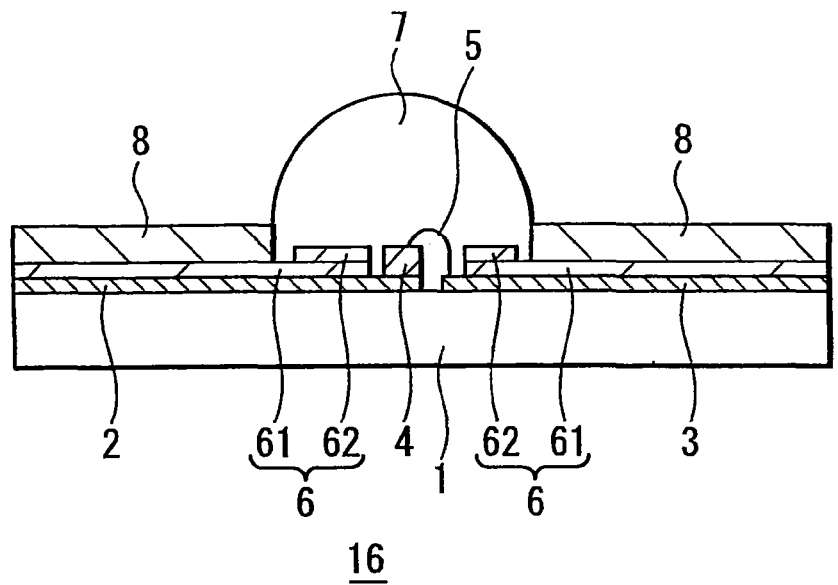
FIG. 7 is a cross-sectional view of main portions of a light source apparatus according to an embodiment of the present invention.

Next, FIG. 7 shows a schematic diagram (cross-sectional view) of main portions of a light source apparatus according to further another embodiment of the present invention.

In a light source apparatus 16 according to the embodiment of the present invention, while the white resist layer 6 is formed by stacking the two resist layers 61, 62, the upper resist layer 62 of the two layers is formed only in the inside of the transparent resin 7.

It should be noted that an opening portion around the light-emitting diode chip 4 is formed identically between the position of the lower resist layer 61 and the position of the upper resist layer 62.

Since the white resist layer 6 is formed by stacking the two resist layers 61, 62 within the transparent resin 7, reflectance of the white resist layer 6 can be increased by increasing the thickness of the white resist layer 6.

Since the upper resist layer 62 is not formed on the outside of the transparent resin 7, it is possible to reduce material costs for the upper resist layer 62.

Figure 8:
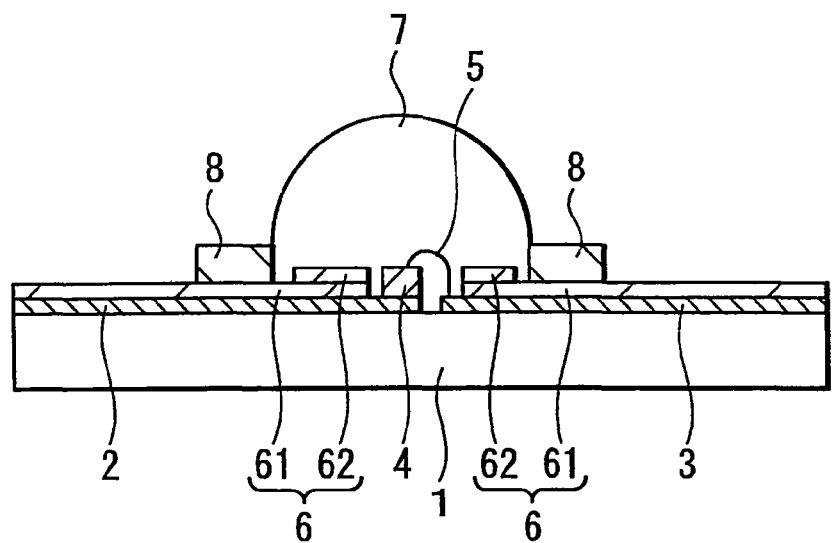
FIG. 8 is a cross-sectional view of main portions of a modified example of the embodiment of FIG. 7.

Next, FIG. 8 shows a schematic diagram (cross-sectional view) of main portions of a light source apparatus obtained by partly modifying the light source apparatus 16 shown in FIG. 7.

In a light source apparatus 17 shown in FIG. 8, the ring-shaped white mark ink member 8 is formed only around the transparent resin 7 similarly to the light source apparatus 11 shown in FIGS. 2A and 2B.

The rest of arrangement is similar to that of the light source apparatus 16 shown in FIG. 7.

Figure 9:
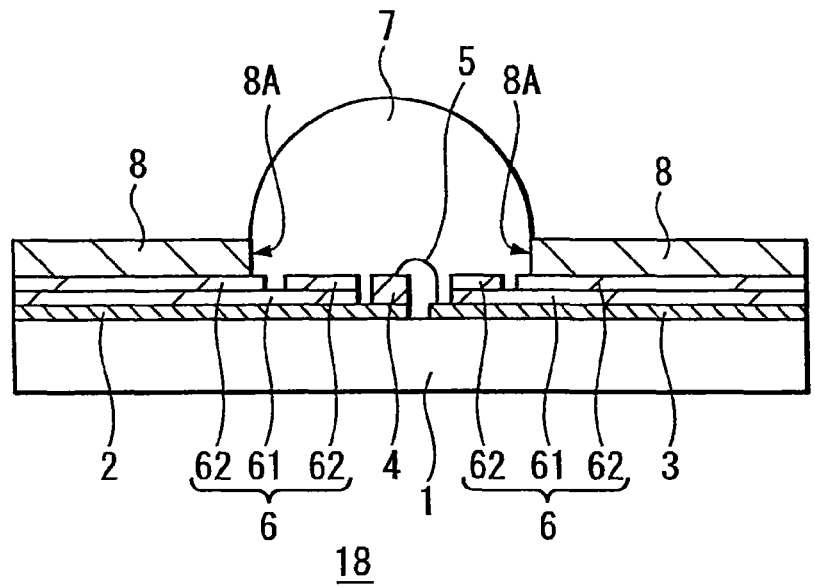
FIG. 9 is a cross-sectional view of main portions of a light source apparatus according to an embodiment of the present invention.

Next, FIG. 9 shows a schematic diagram (cross-sectional view) of main portions of a light source apparatus according to further another embodiment of the present invention.

In a light source apparatus 18 according to the embodiment of the present invention, although the white resist layer 6 is formed by stacking the two resist layers 61, 62, the upper resist layer 62 of the two layers has an opening portion formed near the outer periphery of the transparent resin 7.

The opening portion near the outer periphery of the transparent resin 7 of the upper resist layer 62 is formed having a ring shape along the outer periphery of the transparent resin 7 although not shown.

Also, in the embodiment of the present invention, the inner wall 8A of the white mark ink member 8 is located behind as compared with those of the aforementioned respective embodiments of the present invention so that the inner wall 8A is formed on the outside of the opening portion near the outer periphery of the transparent resin 7 of the upper resist layer 62. As a result, the white mark ink member 8 can be prevented from entering the inside even when a positional relationship between the white resist layer 6 (61, 62) and the white mark ink member 8 is displaced from a predetermined position.

Since the upper resist layer 62 includes the opening portion near the outer periphery of the transparent resin 7, the shape of the transparent resin 7 can be controlled not only by the white mark ink member 8 but also by the opening portion.

Figure 10:
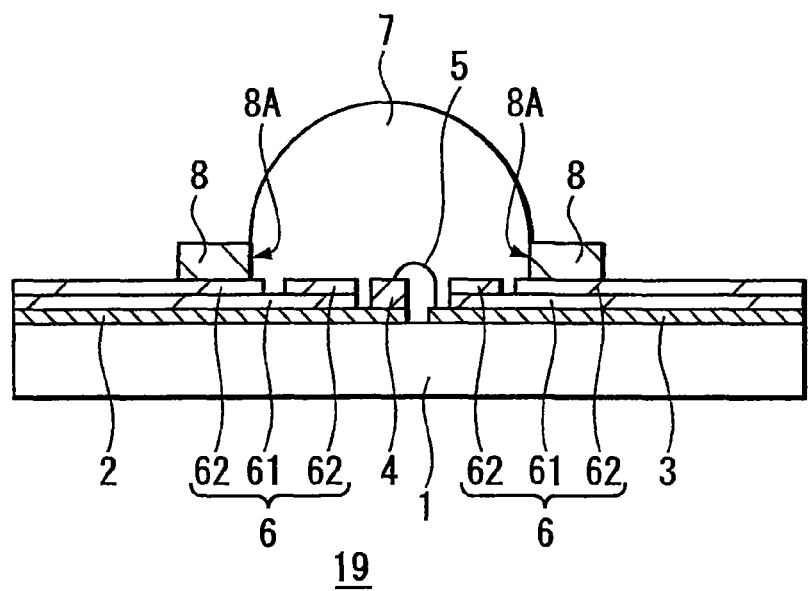
FIG. 10 is a cross-sectional view of main portions of a modified example of the embodiment of FIG. 9.

Next, FIG. 10 shows a schematic diagram (cross-sectional view) of main portions of a light source apparatus obtained by partly modifying the light source apparatus 18 shown in FIG. 9.

In a light source apparatus 19 shown in FIG. 10, the ring-shaped white mark ink member 8 is formed only around the transparent resin 7 similarly to the light source apparatus 11 shown in FIGS. 2A and 2B.

The rest of arrangement is similar to that of the light source apparatus 18 shown in FIG. 9.

Figure 11:
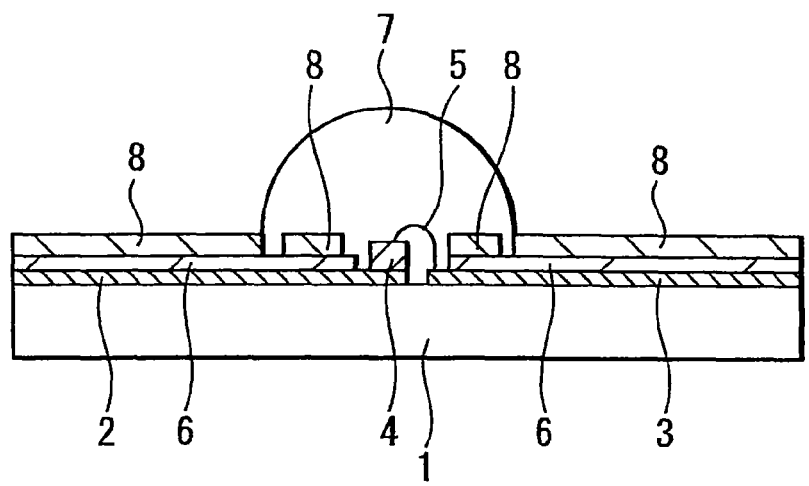
FIG. 11 is a cross-sectional view of main portions of a light source apparatus according to an embodiment of the present invention.

Next, FIG. 11 shows a schematic diagram (cross-sectional view) of main portions of a light source apparatus according to further another embodiment of the present invention.

In a light source apparatus 20 according to the embodiment of the present invention, the white mark ink member 8 is formed also in the inside of the transparent resin 7.

The white mark ink member 8 within the transparent resin 7 is formed having a ring shape along the outer periphery of the transparent resin 7.

Since the white mark ink member 8 is formed also in the inside of the transparent resin 7, reflectance inside the transparent resin 7 can be increased on the side of the substrate 1 by the white mark ink member 8 with high reflectance.

Figure 12:
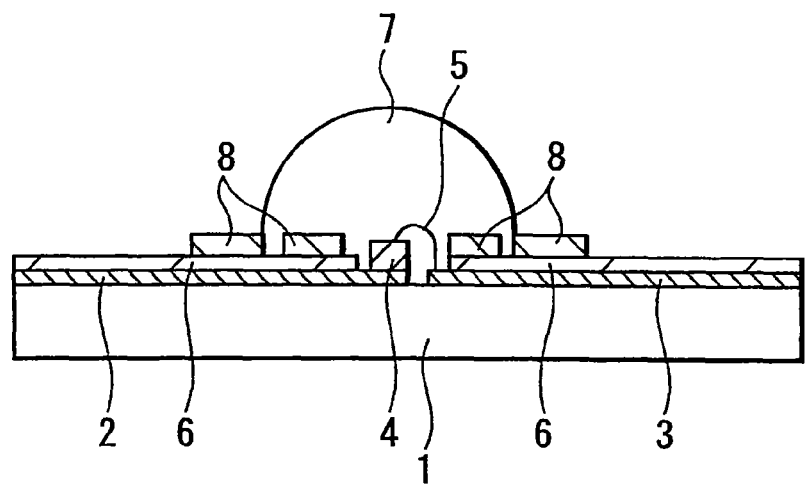
FIG. 12 is a cross-sectional view of main portions of a modified example of the embodiment of FIG. 11.

Next, FIG. 12 shows a schematic diagram (cross-sectional view) of main portions of a light source apparatus obtained by partly modifying the light source apparatus 20 shown in FIG. 11.

In a light source apparatus 21 shown in FIG. 12, the ring-shaped white mark ink member 8 is formed around the transparent resin 7 similarly to the light source apparatus 11 shown in FIGS. 2A and 2B.

The rest of arrangement is similar to that of the light source apparatus 20 shown in FIG. 11.

Figure 13:
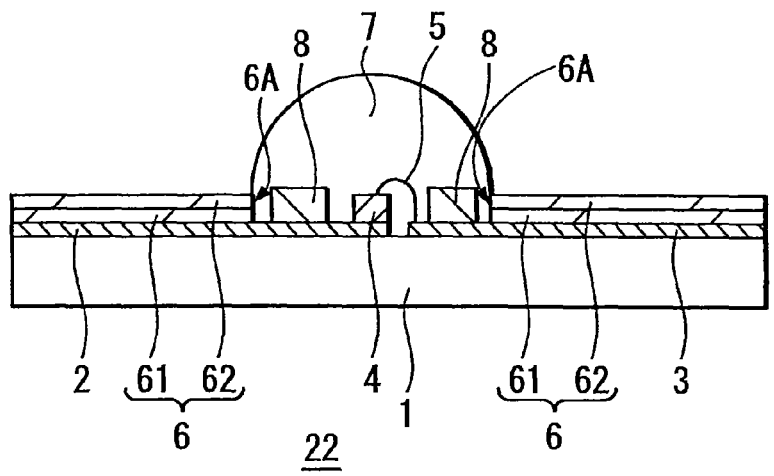
FIG. 13 is a cross-sectional view of main portions of a light source apparatus according to an embodiment of the present invention.

Next, FIG. 13 shows a schematic diagram (cross-sectional view) of main portions of a light source apparatus according to further another embodiment of the present invention.

In a light source apparatus 22 according to the embodiment of the present invention, while the white resist layer 6 is formed by stacking the two resist layers 61, 62, the white resist layer 6 is formed only on the outside of the transparent resin 7, but instead, the white mark ink member 8 is formed in the inside of the transparent resin 7.

It should be noted that the white mark ink member 8 is not formed on the outside of the transparent resin 7.

The embodiment of the present invention differs from the aforementioned respective embodiments in that the shape of the transparent resin 7 is controlled by the inner wall 6A of the opening portion of the white resist layer 6.

Since the white mark ink member 8 is formed within the transparent resin 7, reflectance of the transparent resin 7 can be increased further in its inside on the side of the substrate 1 by the thick white mark ink member 8.

Figure 14:
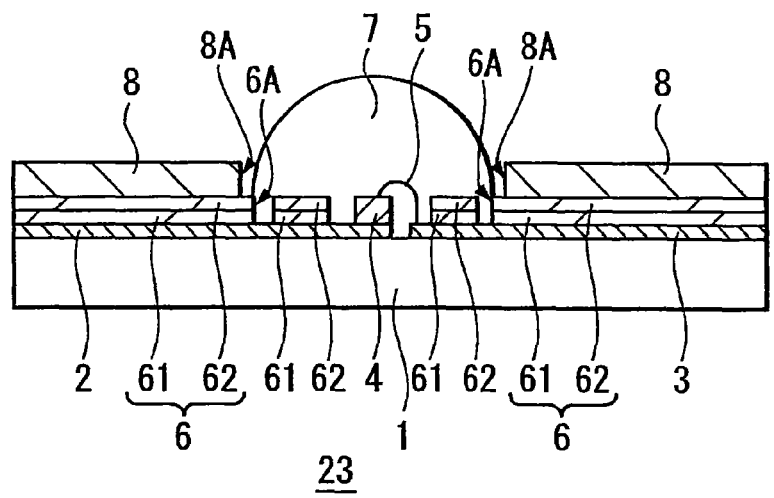
FIG. 14 is a cross-sectional view of main portions of a light source apparatus according to an embodiment of the present invention.

Next, FIG. 14 shows a schematic diagram (cross-sectional view) of main portions of a light source apparatus according to further another embodiment of the present invention.

In a light source apparatus 23 according to the embodiment of the present invention, the white resist layer 6 is formed by stacking the two resist layers 61, 62, the white resist layers 6 are respectively formed on the outside of the transparent resin and in the inside of the transparent resin 7 and the opening portion is formed between the two white resist layers so as to extend along the outer periphery of the transparent resin 7.

Also, the white mark ink member 8 is formed on the white resist layer 6 on the outside of the transparent resin 7, the inner wall 8A of the white mark ink member 8 is located on the outside and is formed on the outside of the opening portion of the white resist layer 6 extended along the transparent resin 7.

Since the white resist layer 6 formed by stacking the two resist layers 61, 62 is formed within the transparent resin 7, reflectance of the transparent resin 7 can be increased in its inside on the side of the substrate 1 with the thick white resist layer 6 formed of the two resist layers 61, 62 reflectance of which is relatively high.

Also, according to the embodiment of the present invention, the shape of the transparent resin 7 is controlled by the inner wall 6A of the opening portion of the white resist layer 6 extended along the outer periphery of the transparent resin 7 and the inner wall 8A of the white mark ink member 8.

Figure 15:
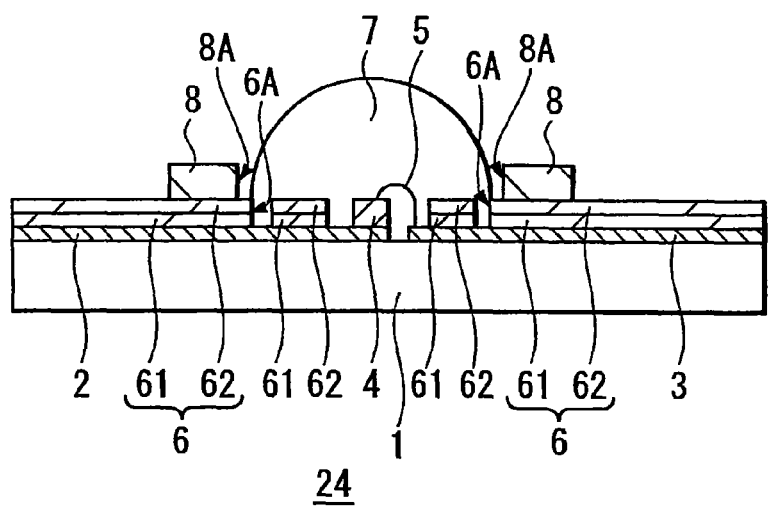
FIG. 15 is a cross-sectional view of main portions of a modified example of the embodiment of FIG. 14.

Next, FIG. 15 shows a schematic diagram (cross-sectional view) of main portions of a light source apparatus obtained by partly modifying the light source apparatus 23 shown in FIG. 14.

In a light source apparatus 24 shown in FIG. 15, the ring-shaped white mark ink member 8 is formed around the transparent resin 7 similarly to the light source apparatus 11 shown in FIGS. 2A and 2B.

The rest of arrangement is similar to that of the light source apparatus 23 shown in FIG. 14.

Figure 16A:
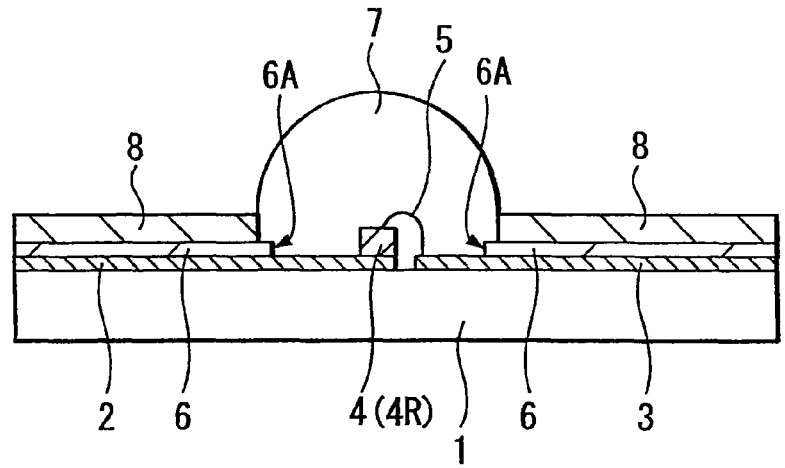
FIGS. 16A and 16B are schematic diagrams of main portions of a light source apparatus according to an embodiment of the present invention.
Figure 16B:
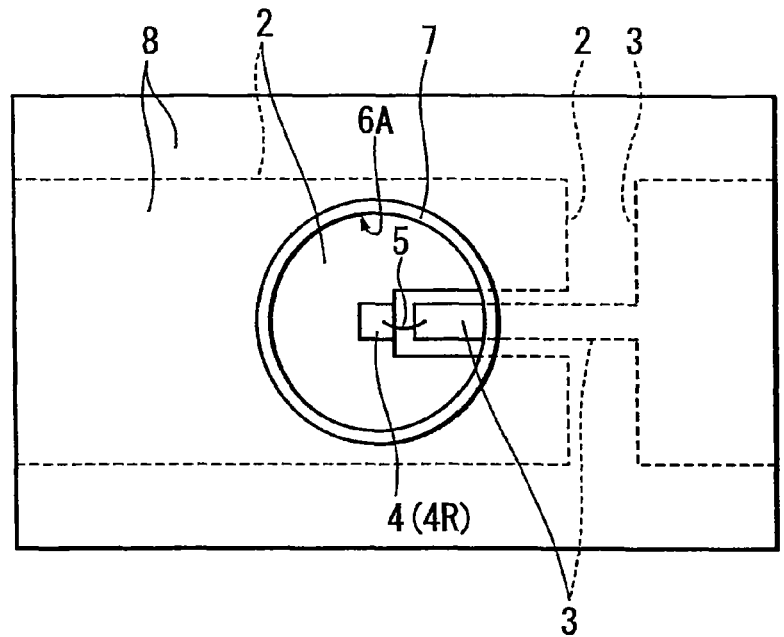

Next, FIGS. 16A and 16B show schematic diagrams of main portions of a light source apparatus according to further another embodiment of the present invention. FIG. 16A is a cross-sectional view and FIG. 16B is a plan view.

According to the embodiment of the present invention, a light source apparatus includes light-emitting diodes which emit light of two or more colors including red R.

For example, the light source apparatus includes light-emitting diodes of three colors of red R, green G and blue B. Then, the respective light-emitting diode chips 4 are individually sealed by the transparent resins 7.

According to the embodiment of the present invention, further, with respect to a light-emitting diode chip 4R of red R, as shown in FIGS. 16A and 16B, the opening portion of the white resist layer 6 is formed with a large area within the transparent resin 7 and electrodes 2, 3 face the transparent resin 7 from the opening portion with the large area.

On the other hand, the light-emitting diode chip 4 (4G) of green G and the light-emitting diode chip 4 (4B) of blue B have similar arrangements to that shown in FIGS. 1A and 1B, in which the white resist layer 6 covers the electrodes 2 and 3 up to a portion close to the chip 4.

Since the metal material of the electrodes 2, 3 has high reflectance for light of a wavelength near red light and has higher reflectance than that of the white resist layer 6, if the opening portion of the white resist layer 6 is formed with the large area and the electrodes 2, 3 face the transparent resin 7 in the light-emitting diode of red R, then it is possible to increase reflectance on the side of the substrate 1.

Since the metal material of the electrodes 2, 3 has low reflectance for light of a wavelength near green light and light of a wavelength near blue light and has lower reflectance than that of the white resist layer 6, if the white resist layer 6 covers the electrodes 2, 3 up to a portion close to the chip 4 with respect to the light-emitting diodes of green G and blue B, then it is possible to increase reflectance on the side of the substrate 1.

It should be noted that, with respect to the light-emitting diode chip 4 (4G) of green G and the light-emitting diode chip 4 (4B) of blue B, the white mark ink member 8 may be provided within the transparent resin 7 so that reflectance may be increased on the side of the substrate 1 by the white mark ink member 8 similarly to the arrangements shown in FIGS. 11 to 13.

Figure 17:
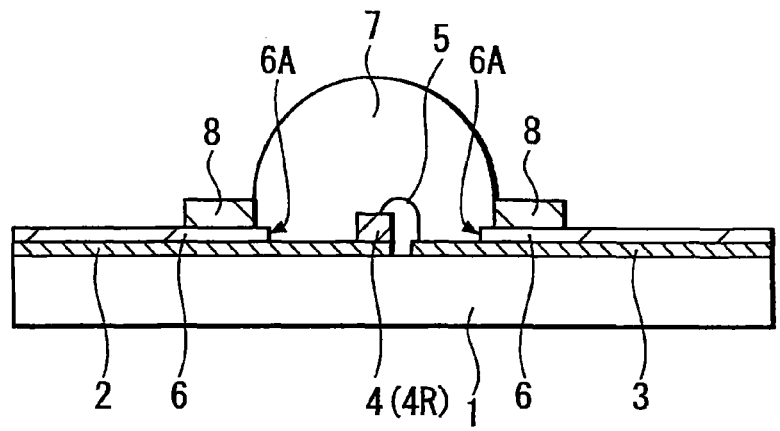
FIG. 17 is a cross-sectional view of main portions of a modified example of the embodiment of FIG. 16.

Also, as shown in a cross-sectional view in FIG. 17, which is obtained by partly modifying the arrangement shown in FIGS. 16A and 16B, the white mark ink member 8 may be formed having a ring shape around the transparent resin 7.

In addition, the arrangement shown in FIGS. 16A and 16B may be modified partly such that the shape of the transparent resin 7 can be controlled by the inner wall 6A of the white resist layer 6 similarly to the arrangement shown in FIG. 13.

Figure 18:
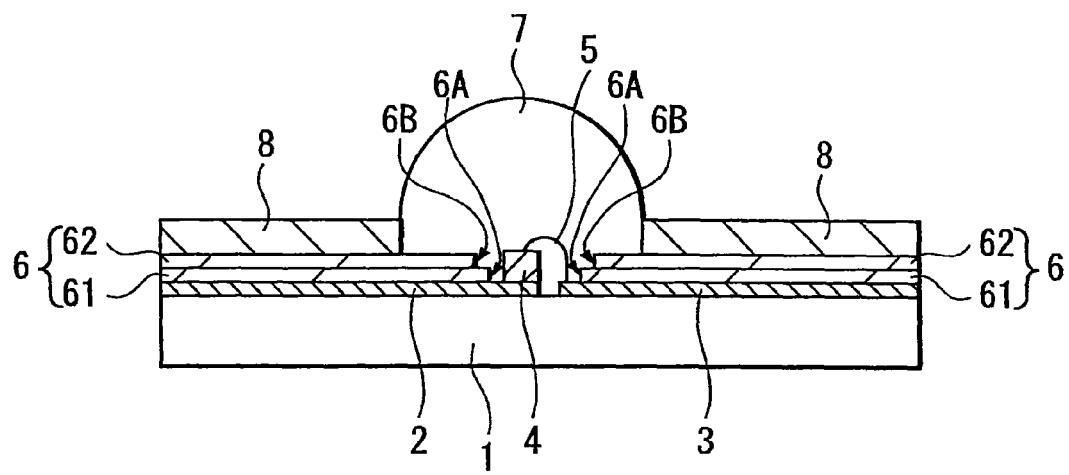
FIG. 18 is a cross-sectional view of main portions of a light source apparatus according to an embodiment of the present invention.

Next, FIG. 18 shows a schematic diagram (cross-sectional view) of main portions of a light source apparatus according to further another embodiment of the present invention.

In a light source apparatus 25 according to the embodiment of the present invention, the white resist layer 6 is formed by stacking the two resist layers 61, 62; further, the area of the opening portion of the upper resist layer 62 is made larger than that of the opening portion of the lower resist layer 61 in the vicinity of the light-emitting diode chip 4.

Since the area of the opening portion of the upper resist layer 62 is made larger than that of the opening portion of the lower resist layer 61 in the vicinity of the light-emitting diode chip 4, the inner wall 6B of the upper resist layer 62 is located behind the inner wall 6A of the lower resist layer 61 so that the white resist layer 6 (61, 62) has a cross-section shaped like a staircase. As a result, the white resist layer 6 (61, 62) has a shape opened in the upper direction so that it is easy to reflect light upward, thereby further increasing efficiency in using emitted light.

Figure 19:
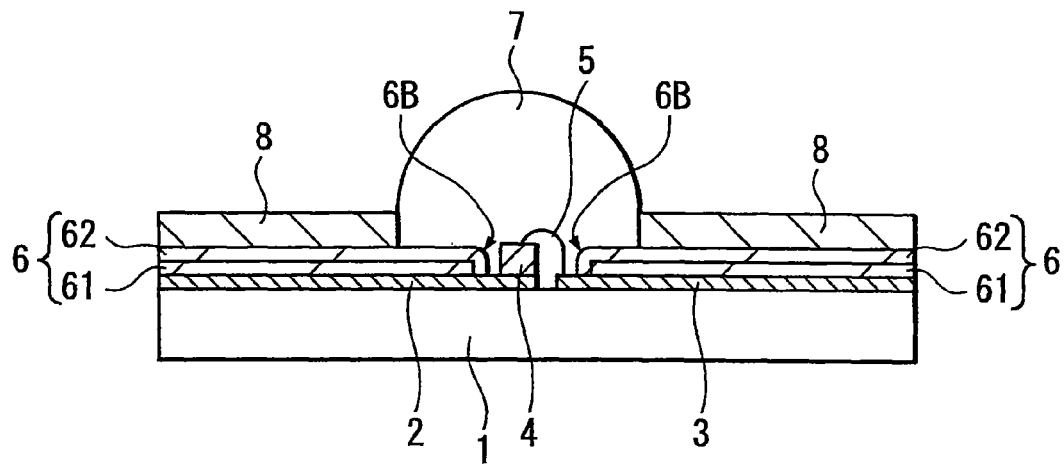
FIG. 19 is a cross-sectional view of main portions of a light source apparatus according to an embodiment of the present invention.

Next, FIG. 19 shows a schematic diagram (cross-sectional view) of main portions of a light source apparatus according to further another embodiment of the present invention.

In a light source apparatus 26 according to the embodiment of the present invention, the white resist layer 6 is formed by stacking the two resist layers 61, 62; further, the area of the opening portion of the upper resist layer 62 is made smaller than that of the opening portion of the lower resist layer 61 in the vicinity of the light-emitting diode chip 4.

Since the area of the upper opening portion of the resist layer 62 is made smaller than that of the opening portion of the lower resist layer 61 in the vicinity of the light-emitting diode chip 4, the edge of the upper resist layer 62 covers the edge of the lower resist layer 61 so that the corner on the surface of the inner wall 6B of the upper resist layer 62 may be rounded. As a result, the white resist layer 6 (61, 62) has a shape opened in the upper direction so that it is easy to reflect light upward, thereby further increasing efficiency in using emitted light.

Figure 20:
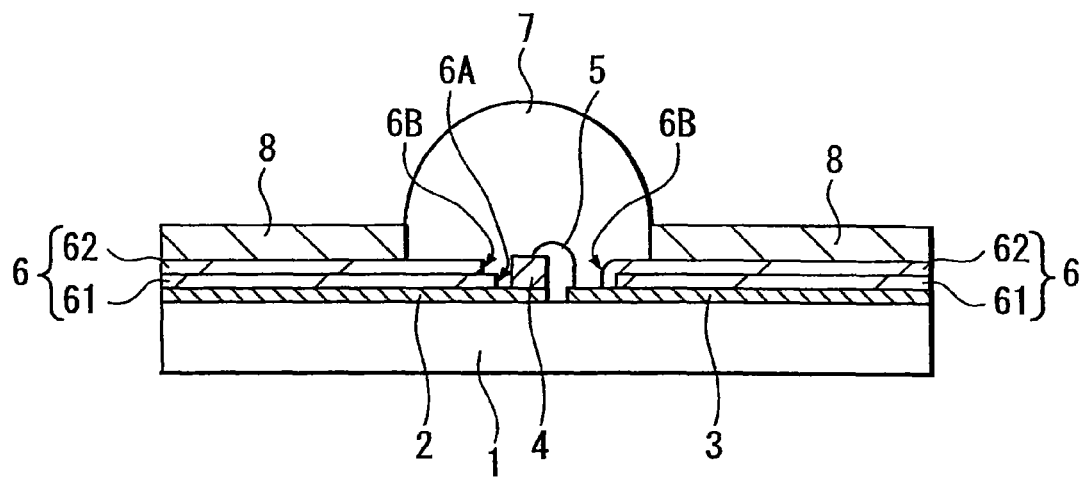
FIG. 20 is a cross-sectional view of main portions of a light source apparatus according to an embodiment of the present invention.

Next, FIG. 20 shows a schematic diagram (cross-sectional view) of main portions of a light source apparatus according to further another embodiment of the present invention.

In a light source apparatus 27 according to the embodiment of the present invention, the white resist layer 6 is formed by stacking the two resist layers 61, 62; further, the area of the opening portion of the upper resist layer 62 and that of the opening portion of the lower resist layer 61 are made equal to each other in the vicinity of the light-emitting diode chip 4, and the position of the opening portion of the upper resist layer 62 and that of the opening portion of the lower resist layer 61 are made different from each other. The opening portion of the upper resist layer 62 is shifted from the opening portion of the lower resist layer 61 to the left as shown in the sheet of drawing.

Since the area of the opening portion of the upper resist layer 62 and that of the opening portion of the lower resist layer 61 are made equal to each other in the vicinity of the light-emitting diode chip 4 and the opening portion of the upper resist layer 62 is shifted from the opening portion of the lower resist layer 61 to the left as shown in the sheet of drawing, in the right and left direction of the sheet of drawing, the inner wall 6B of the upper resist layer 62 is located behind the inner wall 6A of the lower resist layer 61 on the left and the edge of the upper resist layer 62 covers the edge of the lower resist layer 61 on the right. As a result, since the white resist layer 6 (61, 62) is shaped so as to open on any of the right and left, light can be reflected in the upper direction with ease and hence it is possible to further improve efficiency in using emitted light. Furthermore, since the position of the upper resist layer 62 and the position of the lower resist layer 61 are displaced from each other, the area of the opening portion without the upper resist layer 62 and the lower resist layer 61 can be reduced and hence efficiency in using emitted light can further be increased.

It should be noted that, according to the embodiment of the present invention, if the opening portion of the upper resist layer 62 is shifted from the opening portion of the lower resist layer 61 in the front and back direction in FIG. 20, then the white resist layer can be formed so to open in the upper direction on the whole.

Figure 21:
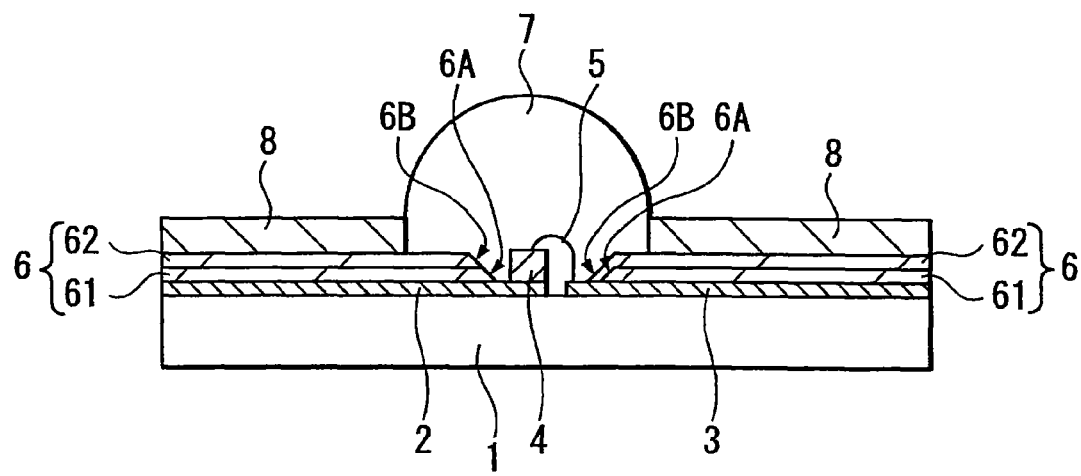
FIG. 21 is a cross-sectional view of main portions of a light source apparatus according to an embodiment of the present invention.

Next, FIG. 21 shows a schematic diagram (cross-sectional view) of main portions of a light source apparatus according to further another embodiment of the present invention.

In a light source apparatus 28 according to the embodiment of the present invention, as compared with the arrangement of the light source apparatus 27 shown in FIG. 20, the inner wall 6A of the opening portion of the lower resist layer 61 and the inner wall 6B of the opening portion of the upper resist layer 62 are shaped to have inclined planes which are both opened in the upper direction.

In order to form the inner walls 6A, 6B of the opening portions of the resist layers 61, 62 as the inclined planes as described above, the resist layers may be illuminated with oblique exposure light when the resist layers 61, 62, for example, are exposed.

Also, an exposure mask may be formed as a specific mask the thickness of which is continuously reduced (or transmittance of exposure light is continuously increased) toward the end portion of the mask.

Furthermore, the inclined planes may be formed by cutting the inner walls, for example, after the resist layers 61, 62 are formed.

Furthermore, the inclined planes can be formed by the resist layers deformed due to their own weights before the resist layers are cured after the resist layers 61, 62 are formed by the printing process.

Since the inner wall 6A of the opening portion of the lower resist layer 61 and the inner wall 6B of the opening portion of the upper resist layer 62 are shaped to have the inclined planes which are both opened in the upper direction, light can be reflected in the upper direction more easily as compared with the case in which the white resist layer has the cross-section shaped like the staircase in the light source apparatus 27 shown in FIG. 20; therefore, it is possible to further increase efficiency in using emitted light.

Figure 22A:
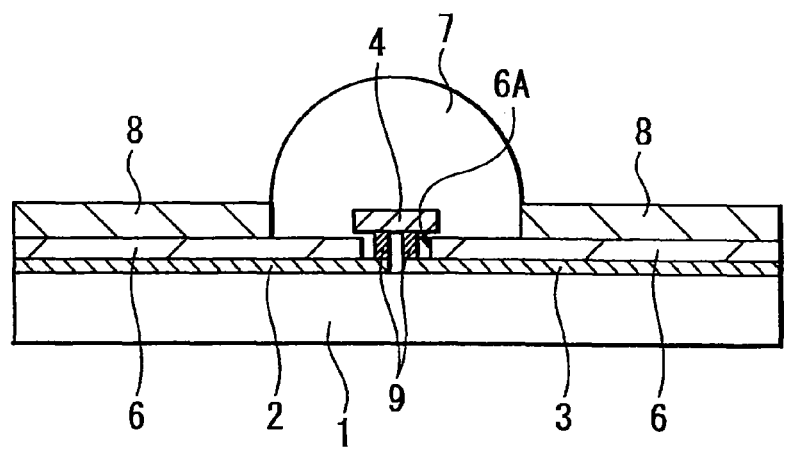
FIGS. 22A and 22B are schematic diagrams of main portions of a light source apparatus according to an embodiment of the present invention.
Figure 22B:
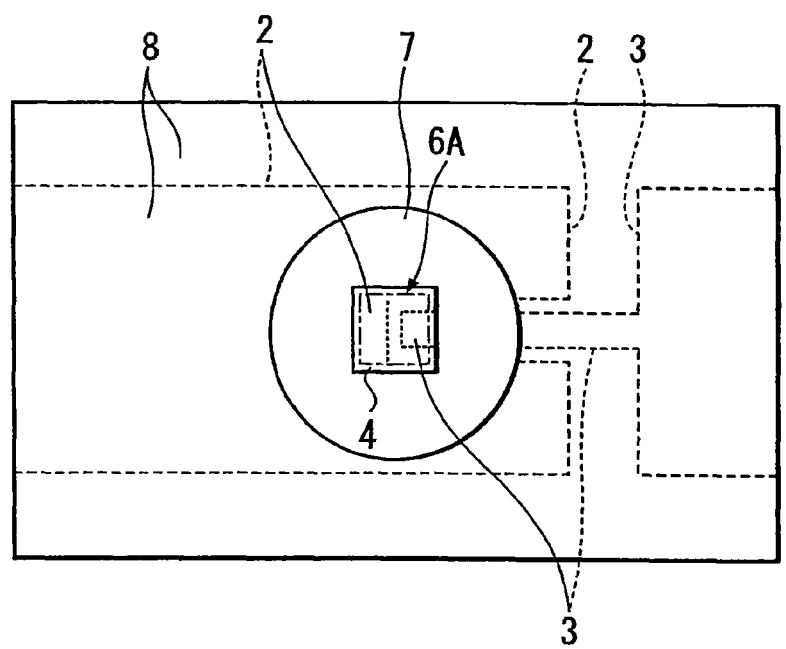

Next, FIGS. 22A and 22B show schematic diagrams of main portions of a light source apparatus according to further another embodiment of the present invention. FIG. 22A shows a cross-sectional view and FIG. 22B shows a plan view.

In a light source apparatus 29 according to the embodiment of the present invention, the light-emitting diode chip 4 is connected to the left and right electrodes 2, 3 by bumps 9 provided under the chip 4.

Also, the upper surface of the white resist layer 6 is located below the lower surface of the chip 4.

Further, the dimension of the opening portion of the white resist layer 6 is made smaller than the outer dimension of the chip 4 so that the white resist layer 6 is extended under the chip 4. The inner wall 6A of the opening portion of the white resist layer 6 is extended under the chip 4 both in the right and left direction and in the front and back direction as shown by chain lines in FIG. 22B.

Since the upper surface of the white resist layer 6 is located below the lower surface of the light-emitting diode chip 4, the upper surface of the white resist layer 6 is located below the light-emitting layer of the light-emitting diode; therefore, light (in particular, light emitted in the lateral direction and light emitted in the lower oblique direction) emitted from the light-emitting layer may be reflected upward by the white resist layer 6, thereby improving reflectance.

Also, since the dimension of the opening portion of the white resist layer 6 is smaller than the outer dimension of the chip 4 so that the white resist layer 6 is extended under the chip, it is possible to further increase reflectance by reflecting upward the light emitted downward from the light-emitting layer.

While the above embodiment of the present invention is particularly suitable for the application to a light-emitting diode chip of a lower surface light-emission type in which a light-emitting layer is located below the device to emit a large amount of light in the lower direction, the embodiment of the present invention can also be applied to a light-emitting diode chip of an upper surface light-emission type, with effects of improving reflectance.

When the light-emitting diode chip 4 is connected to the electrodes 2, 3 of the substrate 1 upon fabricating a light source apparatus, typically an identifying member to determine the position of the chip 4 is located at a position near the place where the chip 4 is disposed.

Typically, a mark ink member (mark ink members of other colors than white) is used as the identifying member, however, if such a mark ink member is used as the member for the light-emitting diode chip 4, there is a risk that light emitted from the light-emitting diode may be absorbed or scattered by the mark ink member.

Alternatively, while a unique shape of an electrode member prepared around the light-emitting device may be used frequently as such identifying member, if the electrode member is exposed more than necessary to other light-emitting devices than a red light-emitting device, then efficiency in using emitted light may be lowered.

Accordingly, in the light source apparatus 29 shown in FIG. 22, the identifying member is formed on the surfaces of the electrodes 2, 3 under the light-emitting diode chip 4 or on the surface of the substrate 1 outside the transparent resin 7, for example.

When the identifying member is formed on the surfaces of the electrodes 2, 3 under the light-emitting diode chip 4, since the identifying member is hidden by the chip 4 after the chip 4 has been mounted on the light source apparatus, emitted light may hardly be applied to the identifying member.

When the identifying member is formed on the surface of the substrate 1 outside the transparent resin 7, since the identifying member is away from the chip, emitted light may hardly be applied to the identifying member.

Further, when the identifying member is formed on the surfaces of the electrodes 2, 3 under the light-emitting diode chip 4, it is possible to use a mark ink member similar to a related-art mark ink member as the identifying member; however, if patterns (corner portions, etc.) of the electrodes 2, 3 are used for the identifying member, then a process for forming an identifying member may not be needed and it becomes possible to reduce a manufacturing cost of a light source apparatus by reducing the number of the processes.

Figure 23:
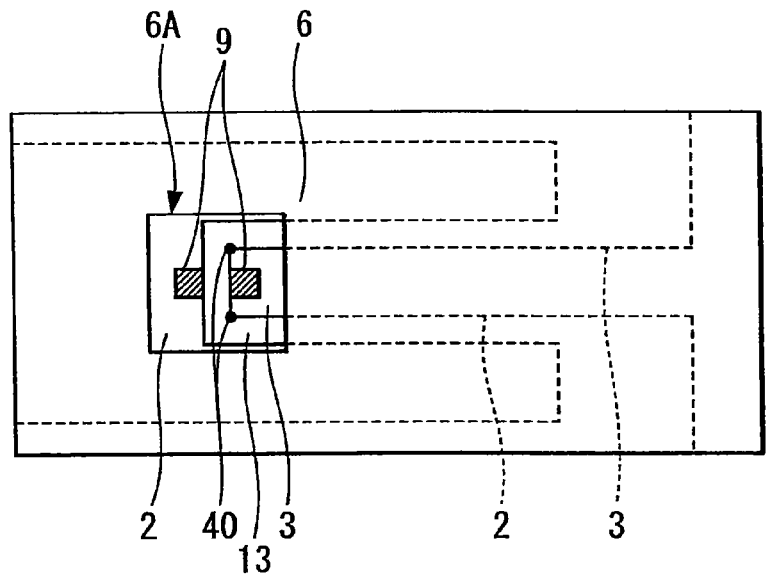
FIG. 23 is an enlarged plan view showing an intermediate state of a process in which the light source apparatus shown in FIG. 22 is fabricated.

Here, the case in which the patterns (corner portions, etc.) of the electrodes 2, 3 are used for the identifying member in the light source apparatus 29 shown in FIG. 22 will be described with reference to FIG. 23. FIG. 23 is an enlarged plan view showing an intermediate state in a process of manufacturing the light source apparatus 29, specifically, a state before the chip 4 is mounted on the light source apparatus.

The right electrode 3 is extended under the bump 9 to the left, and corner portions 40 located at the front left of the electrode 3 and at the back left of the electrode can be used as the identifying member.

Since the electrode 3 is different from the substrate 1 in color or reflectance, the corner portions 40 of the electrode 30 can be determined without difficulty using a device such as a camera.

Also, the corner portion of the left electrode 2 may be used as such identifying member.

It should be noted that, in order to use the corner portions of the electrodes 2, 3 or the like as the identifying member, desirably the corner portions should be located inside the opening portion (inner wall 6A) of the white resist layer 6 so that the corner portion may not be covered with the white resist layer 6.

It should be noted that the light source apparatus 25, 26, 27, 28 and 29 according to the embodiments of the present invention respectively shown in FIGS. 18 to 22 may be modified to have arrangements in which the white mark ink member 8 is formed only around the transparent resin 7 similarly to FIGS. 2A and 2B.

Also, the arrangements of the light source apparatus of the respective embodiments of the present invention shown in FIGS. 1 to 21 may be modified so that the chip may be connected to the right and left electrodes 2, 3 by a device such as bumps without using the wire 5. In this case, since the wire 5 is not used to connect the chip to the electrodes, the arrangement may be substantially symmetric so that the positions of the left and right electrodes 2, 3 and the position of the inner wall of the opening portion of the white resist layer 6 are slightly changed from those shown in FIGS. 1 to 21.

Figure 24:
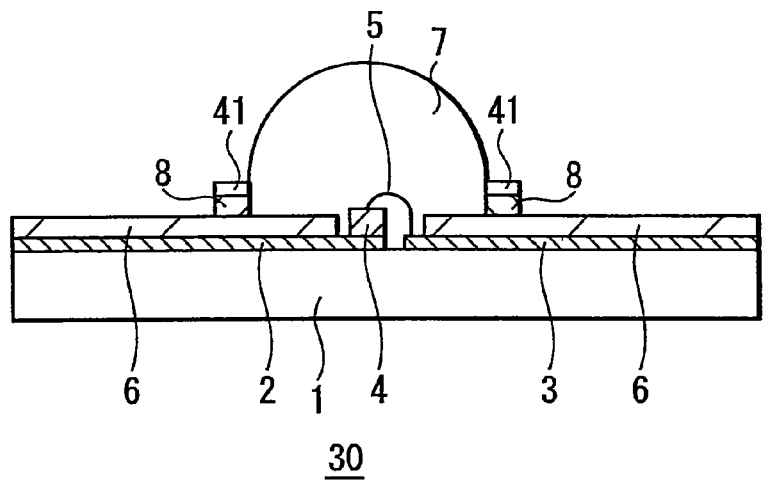
FIG. 24 is a cross-sectional view showing main portions of a light source apparatus according to an embodiment of the present invention.

Next, FIG. 24 shows a schematic diagram (cross-sectional view) of main portions of a light source apparatus according to further another embodiment of the present invention.

In a light source apparatus 30 according to the embodiment of the present invention, a water-repellent member 41 is formed on the ring-shaped white mark ink member 8 around the transparent resin 7.

The water-repellent member 41 is provided to satisfactorily control the shape of the transparent resin 7 by giving water-repellency when water-repellency is not sufficient with the white mark ink member 8 alone.

A water-repellent paint which can be prevented from turning yellow against ultraviolet rays and heat, which is transparent to efficiently use reflectance of the white mark ink member 8 serving as the undercoating and which is relatively low in viscosity may be suitable for a material of the water-repellent member 41. Specifically, a water-repellent agent such as a silicon resin can be used as the water-repellent member 41.

Figure 25:
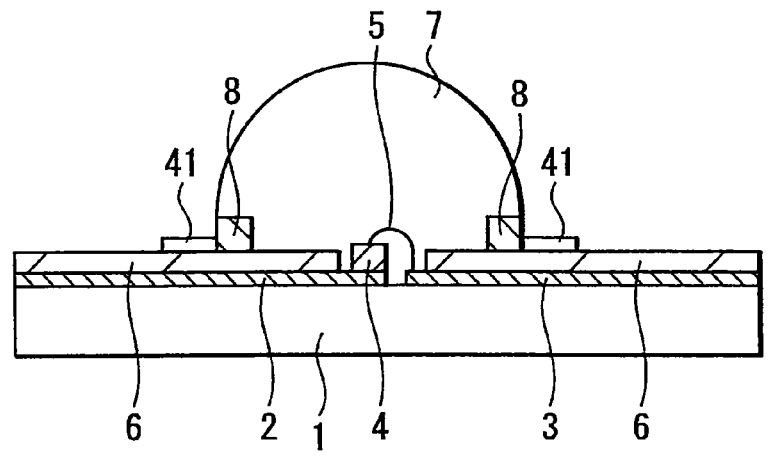
FIG. 25 is a cross-sectional view showing main portions of a light source apparatus according to an embodiment of the present invention.

Next, FIG. 25 shows a schematic diagram (cross-sectional view) of main portions of a light source apparatus according to further another embodiment of the present invention.

In a light source apparatus 31 according to the embodiment of the present invention, the water-repellent member 41 is formed on the outside of the white mark ink member 8 having a ring shape around the transparent resin 7.

In this case, since the water-repellent member 41 is formed in the outside of the white mark ink member 8, the transparent resin 7 is extended up to the inside of the water-repellent member 41.

The rest of arrangement is similar to that of the light source apparatus 30 shown in FIG. 24.

The light source apparatus of the respective embodiments of the present invention shown in FIGS. 1 to 25 can be used for an illumination apparatus, a projector light source, a backlight apparatus of a color liquid-crystal display apparatus and the like.

For example, when the light source apparatus according to the respective embodiments of the present invention are applied to a backlight apparatus, a transmissive color liquid-crystal display panel and the backlight apparatus provided at the back of the color liquid-crystal display panel can constitute a color liquid-crystal display apparatus.

When the present invention is applied to the backlight apparatus used for a color liquid-crystal display apparatus, the light-emitting diode of red R, the light-emitting diode of green G and the light-emitting diode of blue B are respectively sealed with the transparent resins 7, and each of or the predetermined number of the light-emitting diodes of the three colors R, G, B may be arranged in a predetermined fashion (for example, delta arrangement in which the light-emitting diodes are arrayed in the form of triangle), thereby providing light-emitting diode group. Further, the light-emitting diode groups are arrayed in a matrix, for example, to construct a backlight apparatus.

Figure 26:
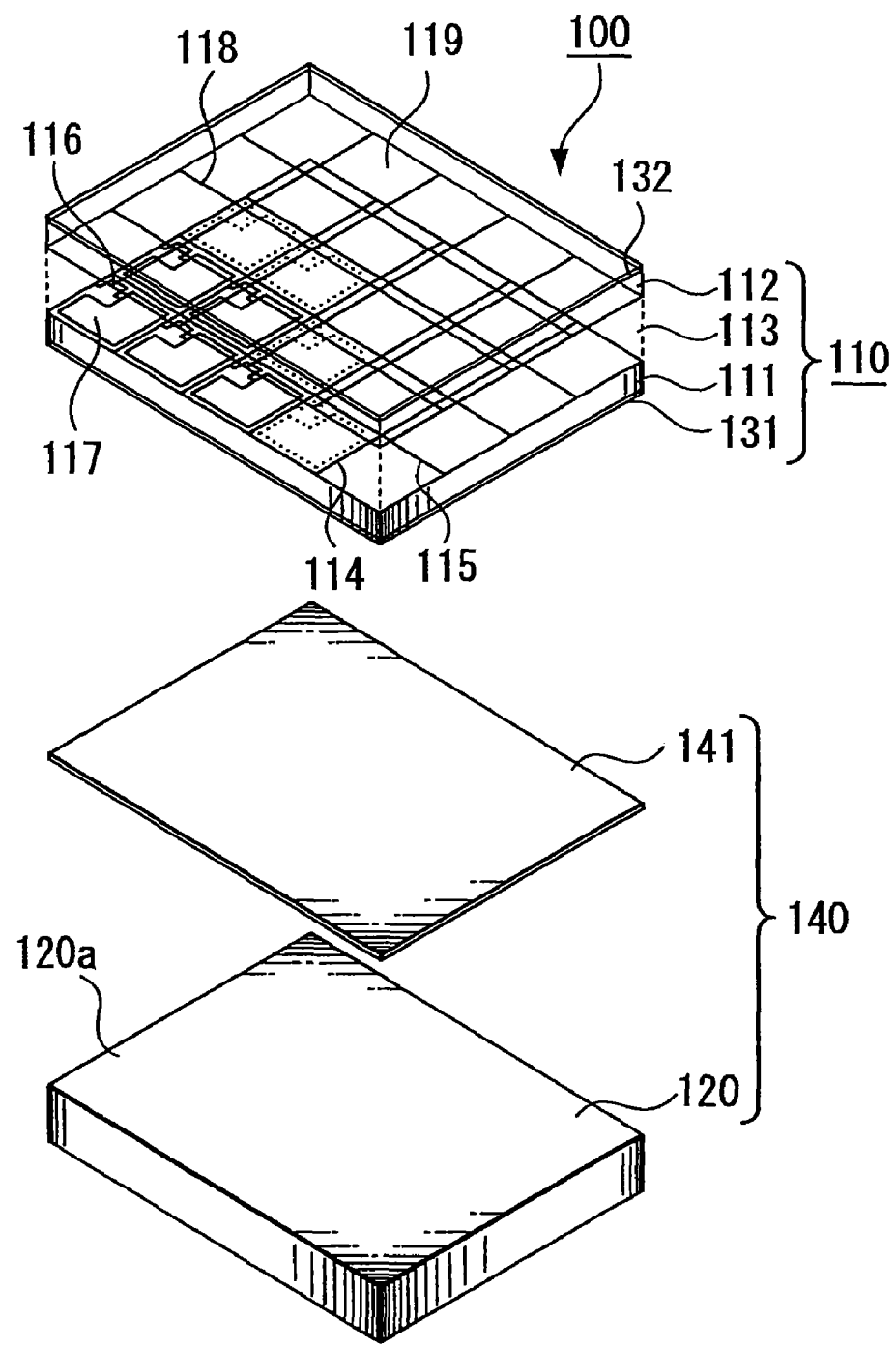
FIG. 26 is a schematic diagram (exploded perspective view) of a color liquid-crystal display apparatus that includes a light source apparatus as a backlight light source thereof according to an embodiment of the present invention.

FIG. 26 shows a schematic diagram (exploded perspective view) of a color liquid-crystal display apparatus according to an embodiment of the present invention.

A color liquid-crystal display apparatus 100 shown in FIG. 26 includes a transmissive color liquid-crystal display panel 110 and a backlight unit 140 provided at the back of the color liquid-crystal display panel 110.

The transmissive color liquid-crystal display panel 110 has an arrangement in which two transparent substrates (TFT substrates 111 and opposing electrode substrates 112) made of glass or the like face each other, and a liquid-crystal layer 113, in which a twisted nematic (TN) liquid-crystal is sealed, is provided in a space between the two opposing substrates. Thin-film transistors (TFT) 116 serving as switching elements arranged in a matrix and pixel electrodes 117 are formed on the TFT substrate 111.

The thin-film transistors 116 are sequentially selected by a scanning line 115 and write a video signal supplied from a signal line 114 into the corresponding pixel electrode 117.

The opposing electrode substrate 112 has an opposing electrode 118 and a color filter 119 formed on its inner surface.

The color filter 119 is divided into segments corresponding to respective pixels although not shown. For example, the color filter is divided into three segments of a red filter, a green filter and a blue filter of three primary colors.

In the color liquid-crystal display apparatus 100, the transmissive color liquid-crystal display panel 110 having the above-mentioned arrangement is sandwiched by two sheet polarizers 131, 132; then, in the state in which the transmissive color liquid-crystal display panel is illuminated with white light from the back using the backlight unit 140, the display apparatus can be driven by an active matrix system to display full color images.

The backlight unit 140 is used to illuminate the color liquid-crystal display panel 110 from the back. As shown in FIG. 26, the backlight unit 140 includes a backlight apparatus 120 including a light source and which surface-emits from a light emitting surface 120a white light mixed with colors of light emitted from the light source and a diffuser 141 stacked on the light emitting surface 120a of the backlight apparatus 120.

The diffuser 141 is used to make brightness uniform in the surface-emission by diffusing the white light emitted from the light emitting surface 120a.

Then, the backlight apparatus 120 is configured such that the light-emitting diode groups, each formed of light-emitting diodes of three colors R, G and B, are arrayed in a matrix, although not shown.

As a result, since light is efficiently emitted from the respective light-emitting diode groups, it is possible to maintain sufficiently high brightness of images displayed on the color liquid-crystal display panel 110.

Also, since sufficiently high brightness of images can be maintained, it becomes possible to display with low energy an image with brightness equal to that provided by the related-art arrangement.

While the light-emitting diode (LED) is used as the light-emitting device in the above-mentioned respective embodiments of the present invention, the present invention is not limited thereto and a light source apparatus can be configured by using other light-emitting devices. For example, it is possible to use a semiconductor laser or the like as the light-emitting device.

EXAMPLES

Subsequently, light source apparatuses were manufactured in practice and reflection spectral distributions were measured.

In the examples, the white resist layer 6 was formed on the substrate 1 and the electrodes 2, 3, the thickness of the white resist layer 6 was changed to 40 μm, 30 μm and 22.5 μm and then respective samples were manufactured.

In addition, samples without the white resist layer 6 were fabricated as comparative examples.

With respect to the respective samples, reflection spectral distributions on the electrodes (wirings) 2, 3 were measured. In the samples of the comparative examples, reflection spectral distributions on the outside of the electrodes (wirings) 2, 3 were also measured.

Figure 27:
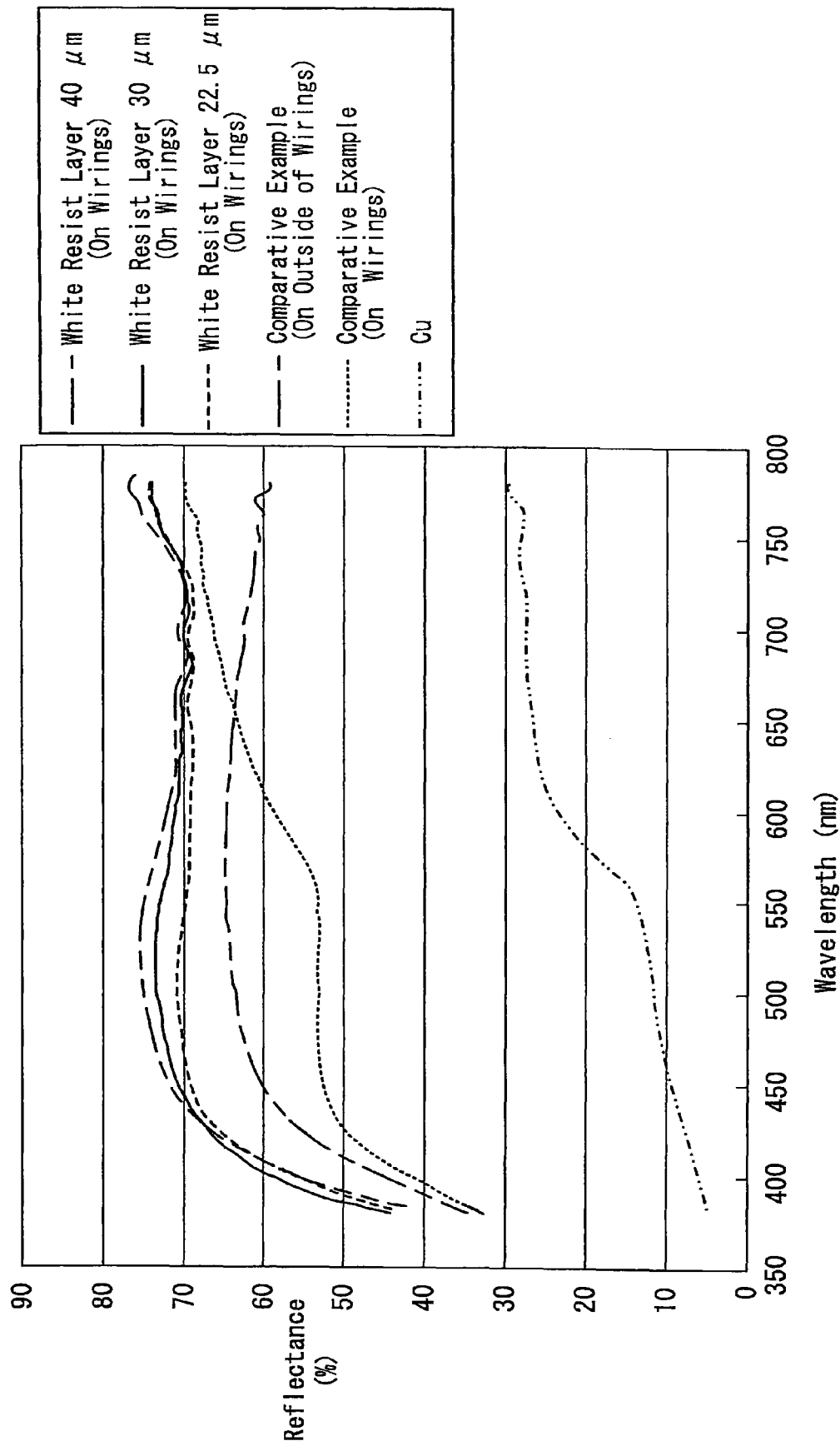
FIG. 27 is a characteristic graph showing reflection spectral distribution of embodiments of light source apparatus and comparative examples thereof.

FIG. 27 shows measured results. Also, FIG. 27 shows reflection spectral distribution of Cu used for a wiring material, for reference.

From FIG. 27, it is to be understood that the respective examples in which the white resist layer 6 is formed on the electrodes (wirings) 2, 3 have substantially similar reflection spectral distributions in which high reflectance can be obtained in a wide wavelength range of visible rays of light. Also, it is to be understood that reflectance is gradually increased as the thickness of the white resist layer 6 is increased to 22.5 μm, 30 μm and 40 μm. It is considered that reflectance is saturated when the thickness of the white resist layer reaches a certain thickness.

On the other hand, the comparative examples have small wavelength dependence on the electrodes (wirings) 2, 3 and have reflectance ranging from 60 to 65%. On the electrodes (wirings) 2, 3, reflectance on the short wavelength side is as low as approximately 53%; and reflectance is gradually increased as the wavelength increases and the comparative examples show tendencies substantially similar to those of reflection spectral distributions of Cu used as a wiring material.

Specifically, since the light source apparatus has the arrangements of the respective embodiments in which the white resist layer 6 is formed on the electrodes (wirings) 2, 3, high reflectance can be obtained in a wide wavelength range of visible rays of light and hence a light emitting efficiency can be improved.

The present invention is not limited to the above-mentioned embodiments and can employ a variety of other arrangements without departing from the gist of the present invention.

DESCRIPTION OF REFERENCE NUMERALS

1 . . . substrate, 2, 3 . . . electrodes, 4 . . . (light-emitting diode) chip, 5 . . . wire, 6 . . . white resist layer, 7 . . . transparent resin, 8, 81 and 82 . . . white mark ink members, 9 . . . bump, 10, 11, 12, 13, 14, 15, 16, 17, 18, 19, 20, 21, 22, 23, 24, 25, 26, 27, 28, 29, 30 and 31 . . . light source apparatus, 41 . . . water-repellent member, 61, 62 . . . resist layers and 100 . . . color liquid-crystal display apparatus

The invention claimed is:

1. A light source apparatus comprising:
a substrate including at least a pair of electrodes, a white resist layer, at least one light-emitting device and a transparent resin for sealing said light-emitting device, wherein,
said white resist layer is on said substrate,
said white resist layer covers a part of each of said pair of electrodes,
said white resist layer includes an opened portion corresponding to said light-emitting device,
said white resist layer has an inclined plane at the opened portion of said white resist layer, the inclined plane effective to reflect light away from the substrate in an upward direction, a white or transparent member for controlling a shape of said transparent resin formed on said white resist layer, and said white resist layer comprising at least two resist layers stacked together such that an upper resist layer is in contact with a lower resist layer.

2. The light source apparatus according to claim 1, wherein said white or transparent member is made of a white print ink.

3. The light source apparatus according to claim 1, wherein said white or transparent member has water-repellency.

4. The light source apparatus according to claim 1, wherein said white resist layer or said white or transparent member has a water-repellent paint formed thereon.

5. The light source apparatus according to claim 1, wherein said white resist layer is formed by stacking two resist layers in which an area of an opening of said upper layer near said light-emitting device is larger than that of an opening of a said lower layer near said light-emitting device.

6. The light source apparatus according to claim 1, wherein said white resist layer is formed by stacking two resist layers in which an area of an opening of said upper layer near said light-emitting device is smaller than that of an opening of said lower layer near said light-emitting device.

7. The light source apparatus according to claim 1, wherein said white resist layer is formed by stacking two resist layers in which an area of an opening of said upper layer near said light-emitting device and that of an opening of said lower layer near said light-emitting device are substantially equal to each other, and a position of said opening of said upper layer is displaced from that of said opening of said lower layer.

8. The light source apparatus according to claim 5, wherein said lower layer is thinner than said upper layer.

9. The light source apparatus according to claim 5, wherein said lower layer includes said opened portion near said light-emitting device, said opened portion being formed as an inclined plane an upper side of which is opened.

10. The light source apparatus according to claim 6, wherein said upper layer includes said opened portion near said light-emitting device, said opened portion being formed as an inclined plane an upper side of which is opened.

11. The light source apparatus according to claim 7, wherein each of said upper layer and said lower layer includes said opened portion near said light-emitting device, said opened portion being formed as an inclined plane an upper side of which is opened.

12. The light source apparatus according to claim 5, wherein said lower layer has an upper surface a height of which is lower than a light-emitting surface of said light-emitting device.

13. The light source apparatus according to claim 12, wherein said opened portion of said lower layer near said light-emitting device has an area smaller than that of said light-emitting device.

14. The light source apparatus according to claim 1, wherein said upper layer of said resist layers is provided only below and on the periphery of said transparent resin.

15. The light source apparatus according to claim 1, wherein said white resist layer has an upper surface a height of which is lower than a light-emitting surface of said light-emitting device.

16. The light source apparatus according to claim 15, wherein said opened portion of said white resist layer near said light-emitting device has an area smaller than that of said light-emitting device.

17. The light source apparatus according to claim 1, wherein
said light-emitting device is formed of at least two light-emitting devices emitting different colors of light including red; and
within said transparent resin which seals said red light-emitting device, said opened portion of said white resist layer has an area larger than that in said transparent resin which seals said light-emitting device of the other colors and said electrode faces said transparent resin from said opened portion with an area larger than that in said transparent resin which seals said light-emitting device of the other colors.

18. The light source apparatus according to claim 1, wherein at least a surface on an electrode side of said substrate is white.

19. The light source apparatus according to claim 1, further comprising an identifying member for determining a position where said light-emitting device is connected to said electrode of said substrate, said identifying member being formed on said electrode below said light-emitting device.

20. The light source apparatus according to claim 1, further comprising an identifying member for determining a position where said light-emitting device is connected to said electrode of said substrate, said identifying member being formed on the surface of said substrate on the outside of said transparent resin.

21. The light source apparatus according to claim 1, wherein said plurality of light-emitting devices are at least light-emitting devices of the same color located on said substrate at equal intervals.

22. A light source apparatus comprising:
a substrate including at least a pair of electrodes, a white resist layer, at least one light-emitting device and a transparent resin for sealing said light-emitting device,
wherein,
said white resist layer is formed on said substrate,
said white resist layer includes an opened portion around said transparent resin and also serves as a member for controlling a shape of said transparent resin,
said white resist layer has an inclined plane at the opened portion of said white resist layer, the inclined plane effective to reflect light away from the substrate in an upward direction.

23. The light source apparatus according to claim 22, wherein a member made of a white print ink is formed on said substrate around said light-emitting device within said transparent resin.

24. The light source apparatus according to claim 22, wherein:
said light-emitting device is formed of at least two light-emitting devices emitting different colors of light including red; and
within said transparent resin which seals said red light-emitting device, said opened portion of said white resist layer has an area larger than that in said transparent resin which seals said light-emitting device of the other colors and said electrode faces said transparent resin from said opened portion with an area larger than that in said transparent resin which seals said light-emitting device of the other colors.

25. The light source apparatus according to claim 1, wherein said light-emitting device is a light-emitting diode.

26. The light source apparatus according to claim 22, wherein said light-emitting device is a light-emitting diode.

27. A display apparatus comprising:
a display unit for displaying images; and
a light source apparatus for illuminating said display unit from the rear,
wherein:
said light source apparatus includes a substrate including at least a pair of electrodes, at least one light-emitting device and a transparent resin for sealing said light-emitting device, in which a white resist layer is formed on said substrate,
said white resist layer is formed to cover part of each of said pair of electrodes and includes an opened portion corresponding to said light-emitting device,
said white resist layer has an inclined plane at the opened portion of said white resist layer, the inclined plane effective to reflect light away from the substrate in an upward direction, and
a white or transparent member for controlling a shape of said transparent resin formed on said white resist layer.

28. A display apparatus comprising:
a display unit for displaying images; and
a light source apparatus for illuminating said display unit from the rear,
wherein,
said light source apparatus includes a substrate including at least a pair of electrodes, at least one light-emitting device, a transparent resin for sealing said light-emitting device, and a white resist layer formed on said substrate,
said white resist layer includes an opened portion around said transparent resin and also serves as a member for controlling a shape of said transparent resin, and
said white resist layer has an inclined plane at the opened portion of said white resist layer, the inclined plane effective to reflect light away from the substrate in an upward direction.

* * * * *